(12) United States Patent
Lee et al.

(10) Patent No.: US 12,022,692 B2
(45) Date of Patent: Jun. 25, 2024

(54) LIGHT EMITTING DISPLAY DEVICE HAVING REDUCED INTERFERENCE BETWEEN ADJACENT PIXELS

(71) Applicant: Samsung Display Co., Ltd., Yongin-si (KR)

(72) Inventors: Doo-Young Lee, Hwaseong-si (KR); Jong Hee Kim, Yongin-si (KR); Yoo Mi Ra, Ansan-si (KR); Kyung-Ho Park, Hwaseong-si (KR); Geun Ho Lee, Hwaseong-si (KR); Chang-Soo Lee, Suwon-si (KR); Tak-Young Lee, Anyang-si (KR); Bo Yong Chung, Suwon-si (KR); Jung Hwan Hwang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 224 days.

(21) Appl. No.: 17/472,088

(22) Filed: Sep. 10, 2021

(65) Prior Publication Data

US 2022/0231107 A1    Jul. 21, 2022

(30) Foreign Application Priority Data

Jan. 18, 2021    (KR) ........................ 10-2021-0006925

(51) Int. Cl.
*H01L 29/08* (2006.01)
*H10K 59/121* (2023.01)
*H10K 59/131* (2023.01)

(52) U.S. Cl.
CPC ..... *H10K 59/1216* (2023.02); *H10K 59/1213* (2023.02); *H10K 59/131* (2023.02)

(58) Field of Classification Search
CPC ............. H10K 59/1216; H10K 59/131; H10K 59/1213
(Continued)

(56) References Cited

U.S. PATENT DOCUMENTS 8,142,839 B2    3/2012    Lee et al.
10,084,030 B2    9/2018    Oh et al.
(Continued)

FOREIGN PATENT DOCUMENTS

KR    100656490    12/2006
KR    20080050647    6/2008
(Continued)

*Primary Examiner* — Phuc T Dang
(74) *Attorney, Agent, or Firm* — KILE PARK REED & HOUTTEMAN PLLC

(57) ABSTRACT

A light emitting display device including: a first pixel including a first lower storage electrode, a first gate electrode of a first driving transistor, and a first upper storage electrode; and a second pixel provided near the first pixel, and including a second lower storage electrode, a second gate electrode of a second driving transistor, and a second upper storage electrode. In a plan view, the first gate electrode and the second gate electrode have first sides facing each other, the first side of the first gate electrode is positioned inside a border of the first lower storage electrode or the first upper storage electrode in a plan view, and the first side of the second gate electrode is positioned inside a border of the second lower storage electrode or the second upper storage electrode in a plan view.

17 Claims, 21 Drawing Sheets

(58) Field of Classification Search
USPC .......................................................... 257/40
See application file for complete search history.

(56) References Cited

U.S. PATENT DOCUMENTS

| | | |
|---|---|---|
| 10,816,845 B2 | 10/2020 | Ahn et al. |
| 10,903,446 B2 | 1/2021 | Son et al. |
| 11,092,841 B2 | 8/2021 | Baek et al. |
| 2018/0151660 A1* | 5/2018 | Kim ................... H10K 59/1213 |
| 2020/0144345 A1 | 5/2020 | Cha et al. |
| 2020/0227509 A1 | 7/2020 | Yoon et al. |

FOREIGN PATENT DOCUMENTS

| | | | | |
|---|---|---|---|---|
| KR | 20160075891 A | * | 6/2016 | ........... H10K 59/123 |
| KR | 20170124065 | | 11/2017 | |
| KR | 20200031750 | | 3/2020 | |
| KR | 20200047947 | | 5/2020 | |
| KR | 20200051901 | | 5/2020 | |
| KR | 20200060587 | | 6/2020 | |
| KR | 20200074742 | | 6/2020 | |
| KR | 20200088940 | | 7/2020 | |
| KR | 20200104451 | | 9/2020 | |
| TW | 1407410 B | * | 9/2013 | ........... H10K 59/131 |

\* cited by examiner (A)

(B)

LIGHT EMITTING DISPLAY DEVICE HAVING REDUCED INTERFERENCE BETWEEN ADJACENT PIXELS

CROSS-REFERENCE TO RELATED APPLICATION

This application claims priority from and the benefit of Korean Patent Application No. 10-2021-0006925, filed on Jan. 18, 2021, which is hereby incorporated by reference for all purposes as if fully set forth herein.

BACKGROUND

Field

Embodiments of the invention relate generally to a light emitting display device, and particularly relates to a light emitting display device for reducing interference between adjacent pixels.

Discussion of the Background

A display device represents a device for displaying images on a screen, and it may is be a liquid crystal display (LCD) and an organic light emitting diode display (OLED). The display device is used to various electronic devices such as portable phones, GPS, digital cameras, electronic books, portable game devices, or various terminals.

The light emitting display device including an organic light emitting device has a self-luminance characteristic, and does not require a separate light source, unlike the LCD, so a thickness and a weight thereof may be reduced. Further, the light emitting display device has desirable characteristics, such as low power consumption, high luminance, and a fast response speed.

The above information disclosed in this Background section is only for enhancement of understanding of the background of the described technology, and therefore it may contain information that does not form the prior art that is already known in this country to a person of ordinary skill in the art.

SUMMARY

Embodiments of the invention provide a light emitting display device for improving display quality by reducing interference between pixels.

Additional features of the inventive concepts will be set forth in the description which follows, and in part will be apparent from the description, or may be learned by practice of the inventive concepts.

An embodiment of the invention provides a emitting display device including: a first pixel including a first lower storage electrode, a first gate electrode of a first driving transistor, and a first upper storage electrode; and a second pixel provided near the first pixel, and including a second lower storage electrode, a second gate electrode of a second driving is transistor, and a second upper storage electrode. In a plan view, the first gate electrode and the second gate electrode respectively have a first side that is one side facing each other, the first side of the first gate electrode is positioned inside a border of the first lower storage electrode or the first upper storage electrode in a plan view, and the first side of the second gate electrode is positioned inside a border of the second lower storage electrode or the second upper storage electrode in a plan view.

The first side of the first gate electrode may be positioned inside a border of the first lower storage electrode and the first upper storage electrode in a plan view, and the first side of the second gate electrode may be positioned inside a border of the second lower storage electrode and the second upper storage electrode in a plan view.

The first lower storage electrode, the first gate electrode, and the first upper storage electrode sequentially may overlap each other to form a first storage capacitor, and the second lower storage electrode, the second gate electrode, and the second upper storage electrode may sequentially overlap each other to form a second storage capacitor.

A first insulating layer and a second insulating layer may be sequentially positioned on the first lower storage electrode and the second lower storage electrode, the first gate electrode and the second gate electrode may be positioned on the second insulating layer, a third insulating layer may be positioned on the first gate electrode and the second gate electrode, and the first upper storage electrode and the second upper storage electrode may be positioned on the third insulating layer.

One side of the first lower storage electrode corresponding to the first side of the first gate electrode may be positioned further outside one side of the first upper storage electrode corresponding to the first side of the first gate electrode in a plan view, and one side of the is second lower storage electrode corresponding to the first side of the second gate electrode may be positioned further outside one side of the second upper storage electrode corresponding to the first side of the second gate electrode in a plan view.

A gap between the one side of the first lower storage electrode corresponding to the first side of the first gate electrode and the one side of the second lower storage electrode corresponding to the first side of the second gate electrode may be equal to or greater than 1 μm.

The first pixel may further include a first input transistor for receiving a data voltage from a first data line, the second pixel may further include a second input transistor for receiving a data voltage from a second data line, the first gate electrode may include a first protrusion connected to the first input transistor, and the second gate electrode may include a second protrusion connected to the second input transistor.

The first protrusion may be positioned outside a border of the first lower storage electrode and the first upper storage electrode in a plan view, and the second protrusion may be positioned outside a border of the second lower storage electrode and the second upper storage electrode in a plan view.

The first protrusion may overlap the first lower storage electrode and may be positioned outside a border of the first upper storage electrode in a plan view, and the second protrusion may be positioned outside a border of the second lower storage electrode and the second upper storage electrode in a plan view.

The first protrusion may overlap the first upper storage electrode and may be positioned outside a border of the first lower storage electrode in a plan view, and the second protrusion may be positioned outside a border of the second lower storage electrode and the second upper storage electrode in a plan view.

The first pixel may further include a first connecting member for connecting the first protrusion and the first input transistor, and the first connecting member may be positioned on a same layer with a same material as the first lower storage electrode.

The first pixel may further include a first connecting member for connecting the first protrusion and the first input transistor, the second pixel may further include a second connecting member for connecting the second protrusion and the second input transistor, and the first connecting member and the second connecting member may be positioned on a same layer with a same material as the first upper storage electrode and the second upper storage electrode.

The light emitting display device may include a third pixel provided near the first pixel, and including a third lower storage electrode, a third gate electrode of a third driving transistor, and a third upper storage electrode, and the second pixel and the third pixel may be positioned on respective sides of the first pixel.

The first gate electrode and the third gate electrode may respectively have a second side facing each other in a plan view, the second side of the first gate electrode may be positioned inside a border of the first lower storage electrode or the first upper storage electrode in a plan view, and the second side of the third gate electrode may be positioned inside a border of the third lower storage electrode or the third upper storage electrode in a plan view.

The first pixel may further include a first input transistor for receiving a data voltage from a data line, the first gate electrode may include a first protrusion connected to the first input transistor, and regarding the first gate electrode, a first portion including the first side may be connected to a second portion including the second side through the protrusion.

The first pixel may further include a first input transistor for receiving a data voltage from a first data line and including a first semiconductor, the second pixel may further is include a second input transistor for receiving a data voltage from a second data line and including a second semiconductor, the third pixel may further include a third input transistor for receiving a data voltage from a third data line and including a third semiconductor, the first gate electrode may include a first protrusion connected to the first input transistor, the second gate electrode may include a second protrusion connected to the second input transistor, the third gate electrode may include a third protrusion connected to the third input transistor, the first pixel may further include a first connecting member for connecting the first protrusion and the first input transistor, the second pixel may further include a second connecting member for connecting the second protrusion and the second input transistor, the third pixel may further include a third connecting member for connecting the third protrusion and the third input transistor, the second semiconductor included in the second input transistor may be bent in a direction that is distant from the first semiconductor and may be connected to the second connecting member, and the third semiconductor included in the third input transistor may be bent in a direction that is distant from the first semiconductor and may be connected to the third connecting member.

The first semiconductor may not be bent and may extend in one direction.

Another embodiment of the invention provides a light emitting display device including a first pixel including a first driving transistor, a first storage capacitor, and a first anode; and a second pixel provided near the first pixel and including a second driving transistor, a second storage capacitor, and a second anode. An interference rate value of the following equation is equal to or less than 0.1%: (C1+C2)/C3. Here, C1 is a capacitance between the second anode and a first gate electrode of the first driving transistor, C2 is a capacitance between a first gate electrode of the first driving transistor and a second gate electrode of the second driving transistor, and C3 is a capacitance of the first storage capacitor of the first pixel.

The first pixel may further include a first input transistor for receiving a data voltage from a data line, and a first connecting member for connecting the first gate electrode of the first driving transistor and the first input transistor, the second storage capacitor of the second pixel may include an upper storage electrode electrically connected to the second anode, and C1 may be a capacitance between the upper storage electrode electrically connected to the second anode and the first connecting member.

The second pixel may further include a second input transistor for receiving a data voltage from a data line, and a second connecting member for connecting the second gate electrode of the second driving transistor and the second input transistor, and C2 may be capacitance between the first connecting member and the second connecting member.

According to the embodiments, the gate electrode of one pixel may be positioned further inside the lower storage electrode or the upper storage electrode overlapping each other from top to bottom in a plan view, thereby reducing interference with the adjacent pixels.

According to the embodiments, the gate electrode of one pixel forms a wide lower storage electrode or upper storage electrode overlapping from top to bottom, thereby reducing the influence transmitted to the gate electrode.

According to the embodiments, when the pixels positioned on respective sides are respectively connected to the data line, they may be bent toward the outside to be symmetric with each other, or interference may be reduced by setting the gap between the adjacent pixels to be equal to or greater than 1 μm.

According to the embodiments, interference between adjacent pixels is reduced by setting the interference rate value between adjacent pixels to be equal to or less than 0.1% on is the adjacent pixels. Here, the interference rate may be induced by Equation 1 in the present specification.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
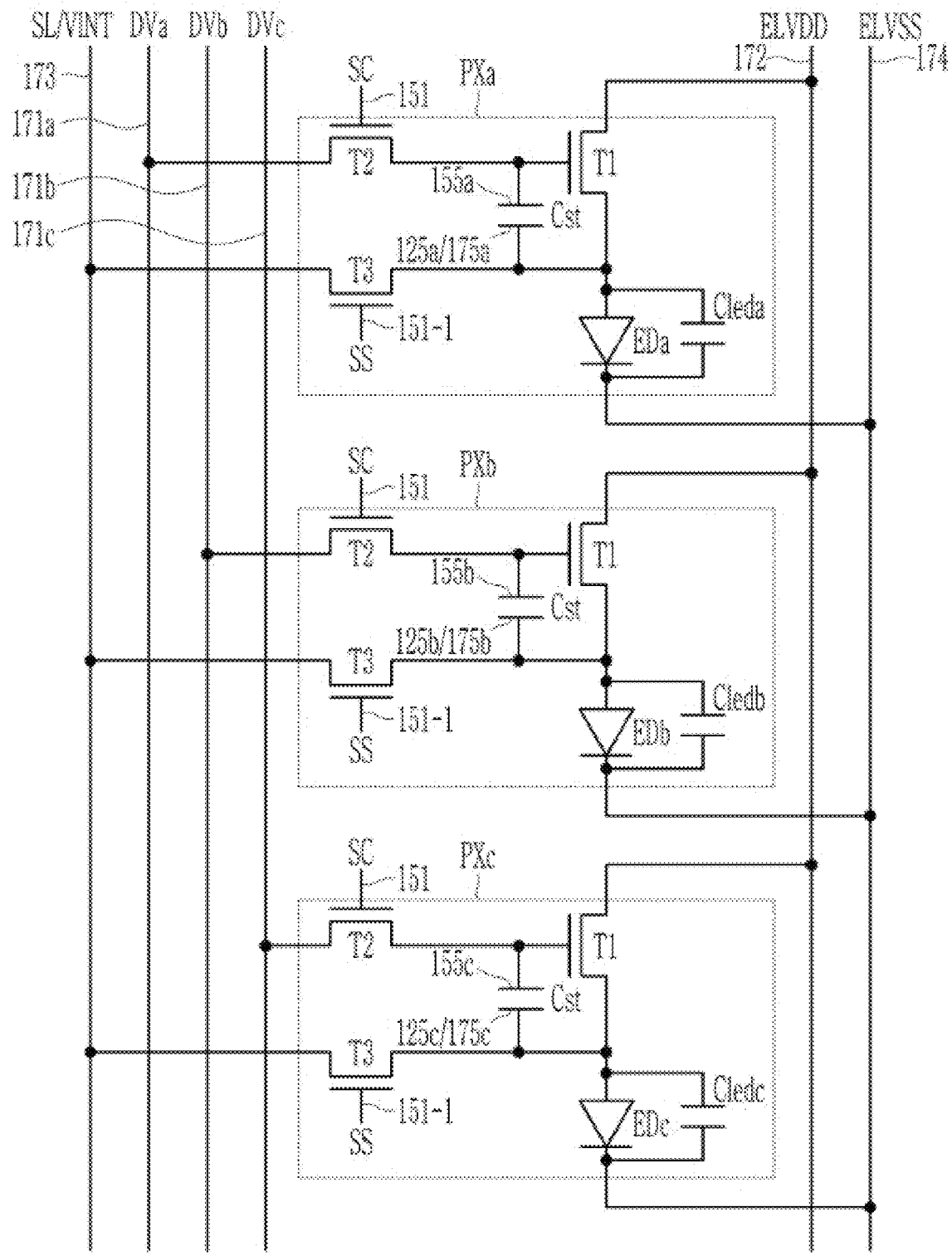
FIG. 1 illustrates a circuit diagram of a pixel of a light emitting display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in is a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular is embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of is the relevant art and should not be interpreted in an idealized or overly formal sense, unless expressly so defined herein.

FIG. 1 illustrates a circuit diagram of a pixel of a light emitting display device according to an embodiment.

FIG. 1 specifically illustrates a circuit diagram of three pixels (PXa, PXb, and PXc) including one group of light emitting diodes (EDa, EDb, and EDc).

A plurality of pixels may include a first pixel (PXa), a second pixel (PXb), and a third pixel (PXc). The first pixel (PXa), the second pixel (PXb), and the third pixel (PXc) respectively include a plurality of transistors (T1, T2, and T3), a storage capacitor (Cst), and light emitting diodes (EDa, EDb, and EDc) that are light-emitting devices. Here, one of the pixels (PXa, PXb, and PXc) may be divided into light emitting diodes (EDa, EDb, and EDc) and a pixel circuit unit, and the pixel circuit unit may include a plurality of transistors (T1, T2, and T3) and a storage capacitor (Cst) in FIG. 1. Further, depending on embodiments, capacitors (Cleda, Cledb, Cledc; emitter capacitors hereinafter) connected to respective ends of the light emitting diodes (EDa, EDb, and EDc), and the emitter capacitors (Cleda, Cledb, and Cledc) may not be included in the pixel circuit unit and may be included in the light emitting diodes (EDa, EDb, and EDc).

A plurality of transistors (T1, T2, and T3) include a driving transistor (T1; first transistor) and two switching transistors T2 and T3, and the two switching transistors include an input transistor (T2; second transistor) and an initialization transistor (T3; third transistor). The respective transistors (T1, T2, and T3) include a gate electrode, a first electrode, and a second electrode, and also include a semiconductor layer including a channel, so a current flows to the channel of the semiconductor layer or is intercepted by a voltage at the gate electrode. Here, one of the first electrode and the second electrode may be a source electrode and the other thereof may be a drain electrode depending on voltages applied to the respective transistors (T1, T2, and T3).

The gate electrode of the driving transistor (T1) is connected to a first end of the storage capacitor (Cst), and is connected to a second electrode (i.e., an electrode on an output side) of the input transistor (T2). The first electrode of the driving transistor (T1) is connected to a driving voltage line 172 for transmitting a driving voltage (ELVDD), the second electrode of the driving transistor (T1) is connected to anodes of the light emitting diodes (EDa, EDb, and EDc), a second end of the storage capacitor (Cst), a first electrode of the initialization transistor (T3), and first ends of the emitter capacitors (Cleda, Cledb, and Cledc). The driving transistor (T1) may receive data voltages (DVa, DVb, and DVc) through the gate electrode according to a switching operation of the input transistor (T2), and may supply a driving current to the light emitting diodes (EDa, EDb, and EDc) according to the voltage at the gate electrode. In this instance, the storage capacitor (Cst) stores the voltage at the gate electrode of the driving transistor (T1) and maintains the same.

The gate electrode of the input transistor (T2) is connected to a first scan signal line 151 for transmitting a first scan signal (SC). The first electrode of the input transistor (T2) is connected to data lines 171a, 171b, and 171c for transmitting data voltages (DVa, DVb, and DVc), and the second electrode of the input transistor (T2) is connected to the first end of the storage capacitor (Cst) and the gate electrode of the driving transistor (T1). A plurality of data lines 171a, 171b, and 171c transmit different data voltages (DVa, DVb, and DVc), and the input transistors (T2) of the respective pixels (PXa, PXb, and PXc) are connected to different data lines 171a, 171b, and 171c. The gate electrodes of the input transistors (T2) of the respective pixels (PXa, PXb, and PXc) may be connected to the same first scan signal line 151 and may receive a is first scan signal (SC) with a same timing. When the input transistors (T2) of the respective pixels (PXa, PXb, and PXc) are simultaneously turned on by the first scan signal (SC) with a same timing, different data voltages (DVa, DVb, and DVc) are transmitted to the gate electrodes of the driving transistors (T1) of the respective pixels (PXa, PXb, and PXc) and the first end of the storage capacitor (Cst) through the different data lines 171a, 171b, and 171c.

An embodiment described with reference to FIG. 1 represents an embodiment in which the gate electrode of the initialization transistor (T3) receives a scan signal that is different from that of the gate electrode of the input transistor (T2).

The gate electrode of the initialization transistor (T3) is connected to a second scan signal line 151-1 for transmitting a second scan signal (SS). The first electrode of the initialization transistor (T3) is connected to the second end of the storage capacitor (Cst), the second electrode of the driving transistor (T1), the anodes of the light emitting diodes (EDa, EDb, and EDc), and the first ends of the emitter capacitors (Cleda, Cledb, and Cledc), and the second electrode of the initialization transistor (T3) is connected to the initialization voltage line 173 for transmitting an initialization voltage (VINT). The initialization transistor (T3) is turned on by the second scan signal (SS) to transmit the initialization voltage (VINT) to the anodes of the light emitting diodes (EDa, EDb, and EDc), the first ends of the emitter capacitors (Cleda, Cledb, and Cledc), and the second end of the storage capacitor (Cst), and initializes the voltage at the anodes of the light emitting diodes (EDa, EDb, and EDc).

The initialization voltage line 173 may function as a sensing line (SL) by sensing the voltages at the anodes of the light emitting diodes (EDa, EDb, and EDc) before applying the initialization voltage (VINT). It may be determined whether the voltages at the anodes are maintained at a target voltage according to the sensing operation. The sensing operation and the is initialization operation for transmitting an initialization voltage (VINT) may be performed at different times, and the initialization operation may be performed after the sensing operation is performed.

According to an embodiment described with reference to FIG. 1, sections for turning on the initialization transistor (T3) and the input transistor (T2) may be distinguished, so a programming operation performed by the input transistor (T2) and an initialization operation (and/or a sensing operation) performed by the initialization transistor (T3) may be performed at different timing.

The first end of the storage capacitor (Cst) is connected to the gate electrode of the driving transistor (T1) and the second electrode of the input transistor (T2), and the second end thereof is connected to the first electrode of the initialization transistor (T3), the second electrode of the driving transistor (T1), the anodes of the light emitting diodes (EDa, EDb, and EDc), and the first ends of the emitter capacitors (Cleda, Cledb, and Cledc). FIG. 1 illustrates reference numerals of the first end and the second end of the storage capacitor (Cst), which clarifies which part corresponds to the storage capacitor (Cst) in FIG. 2. To briefly describe, the first end of the storage capacitor (Cst) is integrally formed with the gate electrodes 155a, 155b, and 155c of the driving transistor (T1), and the second end of the storage capacitor (Cst) is positioned on the lower storage electrodes 125a, 125b, and 125c and the upper storage electrodes 175a, 175b, and 175c. Referring to FIG. 3, regarding a cross-sectional structure of the storage capacitor (Cst), the lower storage electrodes 125a, 125b, and 125c are positioned at the bottom, the gate electrodes 155a, 155b, and 155c of the driving transistors (T1) are positioned thereon in an insulated way, and the upper storage electrodes 175a, 175b, and 175c are positioned thereon in an insulated way. Insulating layers 120, 140, and 160 positioned among the three layers function as dielectric layers, and the lower storage electrodes 125a, 125b, and 125c may be electrically connected to the upper storage electrodes 175a, 175b, and 175c to have the same voltage.

Cathodes of the light emitting diodes (EDa, EDb, and EDc) receive a driving low voltage (ELVSS) through a driving low voltage line 174, and the light emitting diodes (EDa, EDb, and EDc) display a gray by emitting light according to an output current of the driving transistor (T1).

The emitter capacitors (Cleda, Cledb, and Cledc) are formed on respective ends of the light emitting diodes (EDa, EDb, and EDc) to maintain the voltage at the respective ends of the light emitting diodes (EDa, EDb, and EDc) and, accordingly, allow the light emitting diodes (EDa, EDb, and EDc) to display constant luminance.

An operation of a pixel having a circuit of FIG. 1 will now be described.

FIG. 1 illustrates an embodiment in which the transistors (T1, T2, and T3) are n-type transistors, and have a characteristic that they are turned on when a high-level voltage is applied to the gate electrode. However, depending on embodiments, the respective transistors (T1, T2, and T3) may be p-type transistors.

One frame starts when the emission section ends. A high-level second scan signal (SS) is supplied to turn on the initialization transistor (T3). When the initialization transistor (T3) is turned on, an initialization operation and/or a sensing operation may be performed.

An embodiment in which the initialization operation and the sensing operation are performed will now be described.

The sensing operation may be performed before the initialization operation is performed. That is, as the initialization transistor (T3) is turned on, the initialization voltage line 173 functions as a sensing line (SL) to sense the voltages at the anodes of the light emitting diodes (EDa, EDb, and EDc). It may be determined whether the voltages at the anodes are maintained at a target voltage according to the sensing operation.

The initialization operation may then be performed by changing the voltages at the second end of the storage capacitor (Cst), the second electrode of the driving transistor (T1), and the anodes of the light emitting diodes (EDa, EDb, and EDc) to the initialization voltage (VINT) transmitted by the initialization voltage line 173.

As described, the minimum number of transistors may be used, the area occupied by the pixel may be reduced, and the pixel may perform various operations by performing the sensing operation and the initialization operation for transmitting an initialization voltage (VINT) at different times. As a result, resolution of the display panel may be improved.

Together with the initialization operation or at another timing, the first scan signal (SC) is changed to high-level and is then applied, so the input transistor (T2) is turned on, and a programming operation is performed. That is, the data voltages (DVa, DVb, and DVc) transmitted from the data lines 171a, 171b, and 171c through the turned-on input transistor (T2) are input to the gate electrode of the driving transistor (T1) and the first end of the storage capacitor (Cst).

The data voltages (DVa, DVb, and DVc) and the initialization voltage (VINT) are respectively applied to the respective ends of the storage capacitor (Cst) by the initialization operation and the programming operation. While the initialization transistor (T3) is turned on, when an output current is generated by the driving transistor (T1), the output current may be output to an outside through the initialization transistor (T3) and the initialization voltage line 173, so the output current may not be input to the light emitting diodes (EDa, EDb, and EDc). Depending on embodiments, the current may not flow to the light emitting diodes (EDa, EDb, and EDc) by applying the driving voltage (ELVDD) as a low-level voltage or applying the driving low voltage (ELVSS) as a high-level voltage for a programming section for supplying a high-level first scan signal (SC).

When the first scan signal (SC) is changed to low-level, the driving transistor (T1) generates an output current and outputs the output current by the high-level driving voltage (ELVDD) applied to the driving transistor (T1) and the gate voltage of the driving transistor (T1) stored in the storage capacitor (Cst). The output current of the driving transistor (T1) is input to the light emitting diodes (EDa, EDb, and EDc) so that the light emitting diodes (EDa, EDb, and EDc) emit light to thus progress an emission section.

A detailed structure of a pixel circuit unit from among pixels (PXa, PXb, and PXc) with the circuit structure described with reference to FIG. 1 will be described in detail with reference to FIG. 2 to FIG. 4.

Figure 2:
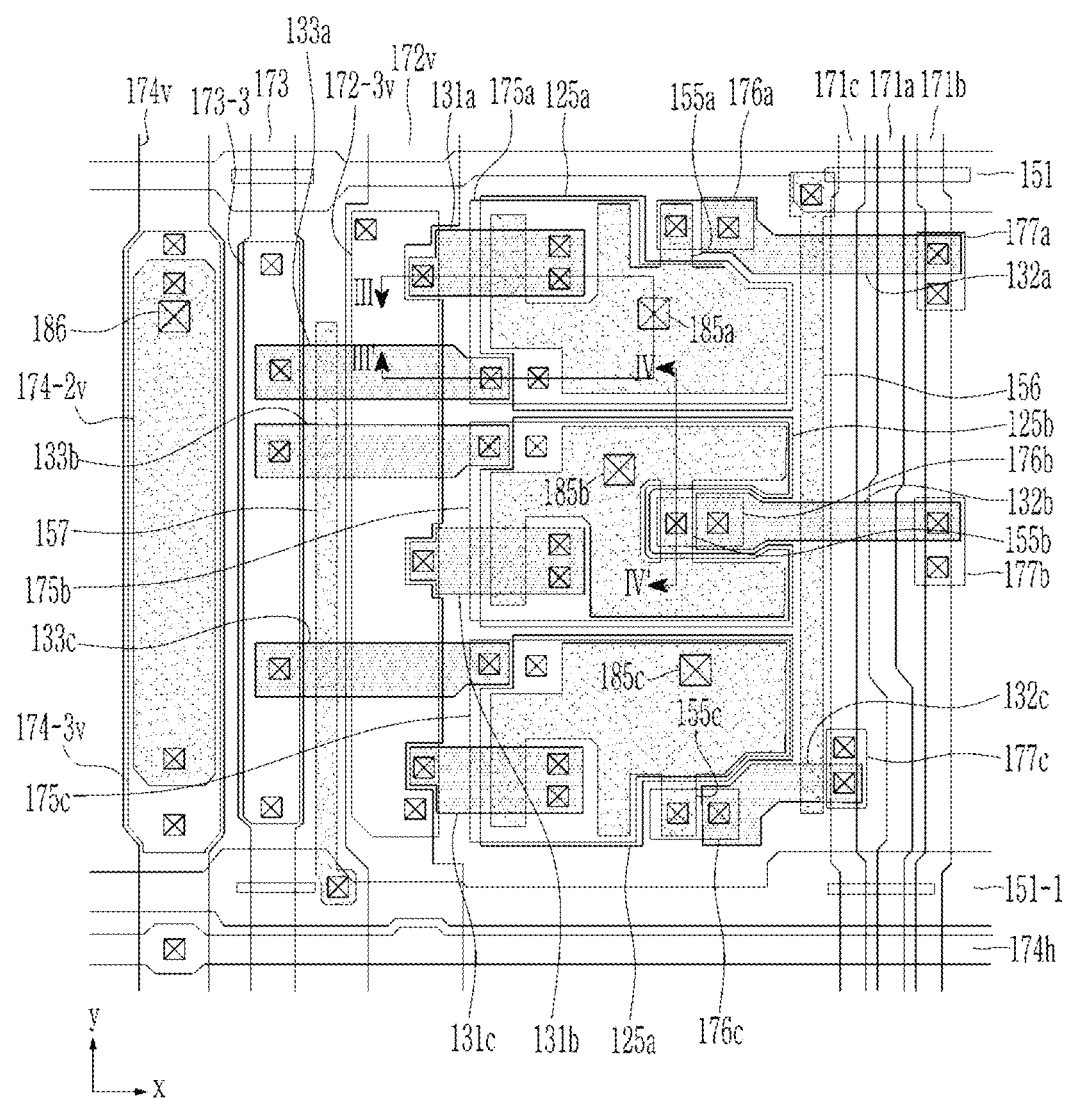
FIG. 2 illustrates a top plan view of part of a light emitting display device according to an embodiment.
Figure 3:
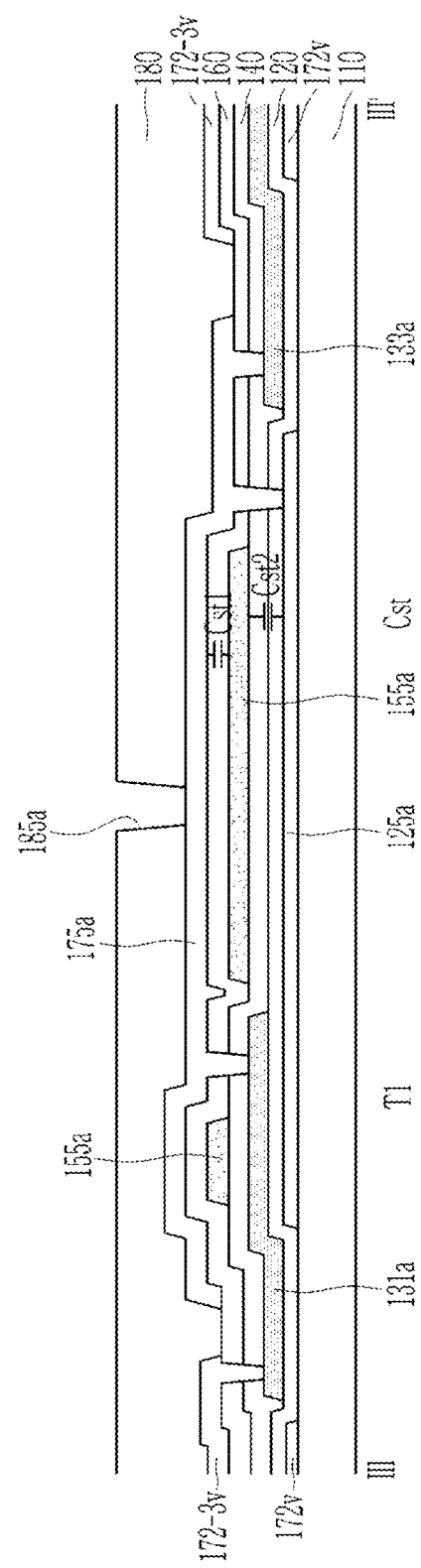
FIG. 3 illustrates a cross-sectional view of a light emitting display device according to an embodiment with respect to a line of FIG. 2.

FIG. 2 shows a top plan view of part of a light emitting display device according to an embodiment; FIG. 3 shows a cross-sectional view of a light emitting display device according to an embodiment with respect to a line of FIG. 2; and FIG. 4 shows a cross-sectional view of a light emitting display device according to an embodiment with respect to a line IV-IV of FIG. 2.

Figure 4:
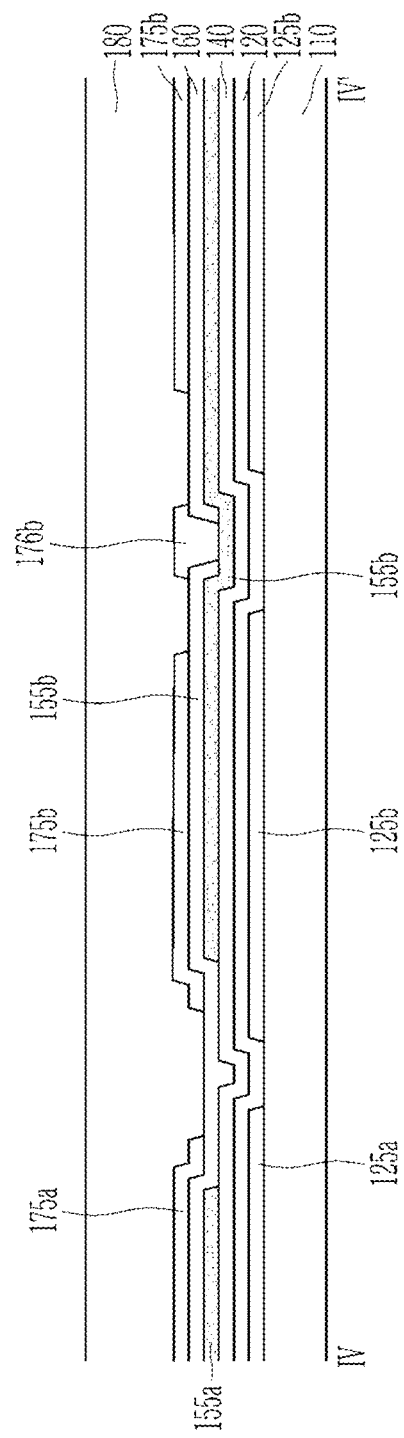
FIG. 4 illustrates a cross-sectional view of a light emitting display device according to an embodiment with respect to a line IV-IV' of FIG. 2.

FIG. 2 to FIG. 4 illustrate a configuration of a pixel circuit unit including a plurality of transistors (T1, T2, and T3) and a storage capacitor (Cst) formed on a substrate 110, and the anodes of the light emitting diodes (EDa, EDb, and EDc) and a structure thereon are not illustrated.

As shown in FIG. 2, the respective pixel circuit units are arranged in a y-axis direction. Referring to FIG. 2, a first pixel circuit unit belonging to the first pixel (PXa) is positioned at a top, a second pixel circuit unit belonging to the second pixel (PXb) is positioned therebelow, and a third pixel circuit unit belonging to the third pixel (PXc) is positioned at a bottom. The three pixels (PXa, PXb, and PXc) will also be referred to as one group of pixels.

A stacked structure of a light emitting display device 10 according to an embodiment will now be described with reference to FIG. 2 to FIG. 4.

The light emitting display device may include a substrate 110. The substrate 110 may include an insulating material such as glass or plastic, and may have flexibility.

A first conductive layer, a first insulating layer 120, a semiconductor layer, a second insulating layer 140, a second conductive layer, a third insulating layer 160, a third conductive layer, and a fourth insulating layer 180 are sequentially positioned on the substrate 110. A first conductive layer, a first insulating layer 120, a semiconductor layer, a second insulating layer 140, a second conductive layer, a third insulating layer 160, a third conductive layer, and a fourth insulating layer 180 are sequentially positioned on the substrate 110. Depending on embodiments, the respective insulating layers may be made of a plurality of layers, and depending on embodiments, the third insulating layer 160 may be an inorganic insulating layer. Here, the inorganic insulating material may include a silicon nitride ($SiN_x$), a silicon oxide ($SiO_x$), and a silicon oxynitride (SiON), and the organic insulating material may include a polyimide, an acryl-based polymer, and a siloxane-based polymer. Further, the first conductive layer, the second conductive layer, and the third conductive layer may include at least one of metals including copper (Cu), aluminum (Al), magnesium (Mg), silver (Ag), gold (Au), platinum (Pt), palladium (Pd), nickel (Ni), neodynium (Nd), iridium (Ir), molybdenum (Mo), tungsten (W), titanium (Ti), chromium (Cr), tantalum (Ta), and an alloy thereof. The first is conductive layer, the second conductive layer, and the third conductive layer may respectively be made of a single layer or a multilayer. For example, they may have a multilayered structure including a lower layer having titanium and an upper layer having copper. In addition, the semiconductor layer may include a semiconductor material such as amorphous silicon, polysilicon, or an oxide semiconductor. In the present embodiment, the semiconductor layer including an oxide semiconductor will be mainly described.

Respective constituent elements included in a pixel circuit unit from among one group of pixels will now be described in detail with reference to FIG. 2 to FIG. 4.

The first scan signal line 151 extends in the x-axis direction, it formed for each one of the pixel circuit units of one group, and it is formed on the third conductive layer as a single layer. The second scan signal line 151-1 extends in the x-axis direction, it is formed for each one of the pixel circuit units of one group, and it is formed on the third conductive layer as a single layer. Depending on embodiments, the first scan signal line 151 and the second scan signal line 151-1 may be formed to be a plurality of layers, such as double layers.

The first scan signal line 151 is electrically connected to the gate electrode 156 positioned on the second conductive layer through an opening. The first scan signal (SC) is transmitted along the first scan signal line 151, and it controls a plurality of input transistors (T2) included in one group of pixel circuit units through the gate electrode 156 electrically connected to the first scan signal line 151.

The second scan signal line 151-1 is electrically connected to the gate electrode 157 positioned on the second conductive layer through an opening. The second scan signal (SS) is transmitted along the second scan signal line 151-1, and it controls a plurality of initialization transistors (T3) included in one group of pixel circuit units through the gate electrode 157 electrically connected to the second scan signal line 151-1.

The data lines 171a, 171b, and 171c extend in a y-axis direction, and the three data lines 171a, 171b, and 171c are positioned on one side of the pixel circuit unit (a right side in FIG. 2). The data lines 171a, 171b, and 171c have a single layer structure, and are formed on the first conductive layer. They may be formed to be a plurality of layers, such as double layers depending on embodiments.

The data lines 171a, 171b, and 171c are respectively electrically connected to the second semiconductors 132a, 132b, and 132c through the connecting members 177a, 177b, and 177c positioned on the third conductive layer. When the three pixels (PXa, PXb, and PXc) belonging to one group of pixels are controlled by one first scan signal line 151 according to the above-noted configuration, they may receive different data voltages (DVa, DVb, and DVc) through the different data lines 171a, 171b, and 171c. As a result, the respective light emitting diodes (EDa, EDb, and EDc) belonging to the respective pixels (PXa, PXb, and PXc) may display different levels of luminance.

The driving voltage line 172 for transmitting the driving voltage (ELVDD) may include a driving voltage line 172v extending in the y-axis direction and an additional driving voltage line (not shown) extending in the x-axis direction. A reduction of the voltage value of the driving voltage (ELVDD) at a specific position may be prevented by transmitting the driving voltage (ELVDD) in the x-axis and y-axis directions. An additional driving voltage line (not shown) may be positioned on the third conductive layer in a like way of an additional driving low voltage line 174h to be described. That is, according to the above-described embodiment, the driving voltage line 172v positioned on the first conductive layer may be electrically connected to an additional driving voltage line (not shown) positioned on the third conductive layer through the opening in the first insulating layer 120, the second insulating layer 140, and the third insulating layer 160.

According to an embodiment described with reference to FIG. 2, the driving voltage line 172v extending in the y-axis direction is formed with the first conductive layer, and it has a double-layer structure in a predetermined section. That is, a driving voltage connector (172-3v) positioned on the third conductive layer is further included on the driving voltage line 172v positioned on the first conductive layer. The driving voltage connector (172-3v) is electrically connected to the driving voltage line 172v through the openings formed in the first insulating layer 120, the second insulating layer 140, and the third insulating layer 160, and the driving voltage (ELVDD) is transmitted to the double layers of the driving voltage line 172v and the driving voltage connector (172-3v), thereby having the merit of reducing wire resistance. The driving voltage connector (172-3v) electrically connects the driving voltage line 172v and the first semiconductors 131a, 131b, and 131c through the openings formed in the second insulating layer 140 and the third insulating layer 160 so that the driving voltage (ELVDD) may be transmitted to the first semiconductors 131a, 131b, and 131c.

The initialization voltage line 173 for transmitting the initialization voltage (VINT) is positioned on a left side of the pixel circuit unit, it is positioned on the first conductive layer, and it extends in the y-axis direction. The initialization voltage line 173 according to the present embodiment includes a section having a double-layer structure. That is, an initialization voltage connector 173-3 positioned on the third conductive layer may be further included on the initialization voltage line 173 positioned on the first conductive layer. The initialization voltage connector 173-3 is electrically connected to the initialization voltage line 173 through the openings formed in the first insulating layer 120, the second insulating layer 140, and the third insulating layer 160. The initialization voltage (VINT) is transmitted to the double layers of the initialization voltage line 173 and the initialization voltage connector 173-3, thereby having the merit of reducing wire resistance. The initialization voltage connector 173-3 is electrically connected to the third semiconductors 133a, 133b, and 133c through the openings formed in the second insulating layer 140 and the third insulating layer 160 so that the initialization voltage (VINT) may be transmitted to the third semiconductors 133a, 133b, and 133c.

Referring to an embodiment described with reference to FIG. 2, a driving low voltage line 174 for transmitting the driving low voltage (ELVSS) applied to the cathodes (refer to 270 of FIG. 21) of the light emitting diodes (EDa, EDb, and EDc) is formed on the pixel circuit unit.

The driving low voltage line 174 for transmitting a driving low voltage (ELVSS) may include a driving low voltage line 174v extending in the y-axis direction and an additional driving low voltage line 174h extending in the x-axis direction. The driving low voltage line 174v positioned on the first conductive layer is electrically connected to the additional driving low voltage line 174h positioned on the third conductive layer through the openings formed in the first insulating layer 120, the second insulating layer 140, and the third insulating layer 160. A reduction of the voltage value of the driving low voltage (ELVSS) at a specific position may be prevented by transmitting the driving low voltage (ELVSS) in the x-axis and y-axis directions.

The additional driving low voltage line 174h positioned on the third conductive layer is electrically connected to the cathodes (refer to 270 of FIG. 21) of the light emitting diodes (EDa, EDb, and EDc) by the opening 186 positioned in the fourth insulating layer 180, and the driving low voltage (ELVSS) is transmitted to the cathodes. Depending on embodiments, a cathode connector (not shown) positioned on the fourth insulating layer 180 and connecting the cathode (refer to 270 of FIG. 21) of the light emitting diodes (EDa, EDb, and EDc) may be further included.

Referring to FIG. 1, the driving low voltage (ELVSS) may be applied to one-side electrode of the emitter capacitor.

A plurality of transistors (T1, T2, and T3) have the same stacking structure, and include a channel positioned on the gate electrode and the semiconductor layer positioned on the second conductive layer, and a first region and a second region positioned on respective sides of the channel and doped to have a same/similar characteristic as/to a conductor. The first region and the second region positioned on the semiconductor layer may correspond to the first electrode and second electrode described with reference to FIG. 1.

The respective transistors will now be described in detail.

The driving transistor (T1) has a channel, a first region, and a second region on the first semiconductors 131a, 131b, and 131c positioned on the first insulating layer 120, and the first region and the second region are doped to have a same or similar conductive characteristic as/to a conductor. The first regions of the first semiconductors 131a, 131b, and 131c are electrically connected to the driving voltage line 172v through the opening and the driving voltage connector (172-3v) to receive the driving voltage (ELVDD). In detail, the driving voltage line 172v is connected to the driving voltage connector (172-3v) through the openings formed in the first insulating layer 120, the second insulating layer 140, and the third insulating layer 160, and the driving voltage connector (172-3v) is electrically connected to the first semiconductors 131a, 131b, and 131c through the openings formed in the second insulating layer 140 and the third insulating layer 160. The second regions of the first semiconductors 131a, 131b, and 131c are electrically connected to the upper storage electrodes 175a, 175b, and 175c through the openings formed in the second insulating layer 140 and the third insulating layer 160. The upper storage electrodes 175a, 175b, and 175c are electrically connected to the lower storage electrodes 125a, 125b, and 125c through the openings formed in the first insulating layer 120, the second insulating layer 140, and the third insulating layer 160, and are electrically connected to the third semiconductors 133a, 133b, and 133c through the openings formed in the second insulating layer 140 and the third insulating layer 160. As a result, the first semiconductors 131a, 131b, and 131c are electrically connected to the lower storage electrodes 125a, 125b, and 125c and the first regions of the third semiconductors 133a, 133b, and 133c.

The first semiconductors 131a, 131b, and 131c are covered by the second insulating layer 140, and gate electrodes 155a, 155b, and 155c are formed on the second insulating layer 140. In a plan view, a channel is formed on the first semiconductors 131a, 131b, and 131c overlapping the gate electrodes 155a, 155b, and 155c, and the channel is covered by the gate electrodes 155a, 155b, and 155c and is not doped. The gate electrodes 155a, 155b, and 155c have protrusions, and the protrusions are electrically connected to the second semiconductors 132a, 132b, and 132c through the opening and the connecting members 176a, 176b, and 176c. In detail, the gate electrodes 155a, 155b, and 155c positioned on the second conductive layer are electrically connected to the connecting members 176a, 176b, and 176c positioned on the third conductive layer through the opening formed in the third insulating layer 160, and the connecting members 176a, 176b, and 176c are electrically connected to the second semiconductors 132a, 132b, and 132c through the openings formed in the second insulating layer 140 and the third insulating layer 160. The connecting members 176a, 176b, and 176c are positioned on the same layer with a same material as the upper storage electrodes 175a, 175b, and 175c.

According to an embodiment described with reference to FIG. 2, the three gate electrodes 155a, 155b, and 155c included in the three pixels (PXa, PXb, and PXc) may have different planar structures.

The three gate electrodes 155a, 155b, and 155c according to an embodiment described with reference to FIG. 2 may have a top-to-bottom symmetric structure in a predetermined region with respect to an imaginary line passing through a center of the gate electrode 155b of the second pixel (PXb) in the x-axis direction. That is, regarding a portion in which the three gate electrodes 155a, 155b, and 155c are electrically connected to the second semiconductors 132a, 132b, and 132c, the gate electrode 155a of the driving transistor (T1) of the first pixel (PXa) is electrically connected to the second semiconductor 132a at the top, the gate electrode 155b of the driving transistor (T1) of the second pixel (PXb)

is electrically connected to the second semiconductor 132*b* in the middle, and the gate electrode 155*c* of the driving transistor (T1) of the third pixel (PXc) is electrically connected to the second semiconductor 132*c* at the bottom. However, according to an embodiment described with reference to FIG. 2, the three gate electrodes 155*a*, 155*b*, and 155*c* do not have a top-to-bottom symmetric structure on a portion in which they overlap the first semiconductors 131*a*, 131*b*, and 131*c*.

Respective structures of the gate electrodes 155*a*, 155*b*, and 155*c* will now be described in detail.

The gate electrode 155*a* of the driving transistor (T1) of the first pixel (PXa) includes a first portion overlapping the first semiconductor 131*a* and a second portion extending from the first portion, overlapping the lower storage electrode 125*a* and the upper storage electrode 175*a*, and configuring a second-side electrode of the storage capacitor (Cst). The gate electrode 155*a* of the driving transistor (T1) of the first pixel (PXa) further includes a protrusion that protrudes and is electrically connected to the connecting member 176*a* through the opening formed in the third insulating layer 160. The second region of the first semiconductor 131*a* may include a portion that is removed so as to be electrically connected to the upper storage electrode 175*a* through the openings formed in the second insulating layer 140 and the third insulating layer 160. The upper storage electrode 175*a* may include a portion that is removed so as to be electrically connected to the lower storage electrode 125*a* through the openings formed in the first insulating layer 120, the second insulating layer 140, and the third insulating layer 160.

A border line of the gate electrode 155*a* of the driving transistor (T1) of the first pixel (PXa) may be positioned, except for the protrusion, to be further inside a border line of the lower storage electrode 125*a* overlapping the same and/or a border line of the upper storage electrode 175*a* in a plan view. That is, in a plan view, the gate electrode 155*a* of the driving transistor (T1) has a first side that is a first-side side facing the gate electrode 155*b* of the adjacent driving transistor (T1), and the facing first side of the gate electrode 155*a* may be positioned inside a border of the lower storage electrode 125*a* and/or the upper storage electrode 175*a*. As a result, the gate electrode 155*a* of the driving transistor (T1) of the first pixel (PXa) forms a relatively smaller parasitic capacitance with adjacent pixels (PXb)(refer to Cp of FIG. 5). That is, as shown in FIG. 4, the gate electrode 155*a* is protected by the lower storage electrode 125*a* and/or the upper storage electrode 175*a*, so the lower storage electrode 125*a* and/or the upper storage electrode 175*a* mainly forms parasitic capacitance with the adjacent pixel (PXb). This is because the gate electrode 155*a* of the driving transistor (T1) of the first pixel (PXa) is covered by the lower storage electrode 125*a* and/or the upper storage electrode 175*a* positioned at the top and the bottom, and also because the same is connected to the lower storage electrode 125*a* and/or the upper storage electrode 175*a* before most of the generated power line enters the gate electrode 155*a*.

The gate electrode 155*b* of the driving transistor (T1) of the second pixel (PXb) includes a first portion overlapping the first semiconductor 131*b* and a second portion extending from the first portion, overlapping the lower storage electrode 125*b* and the upper storage electrode 175*b*, and configuring a second-side electrode of the storage capacitor (Cst). The gate electrode 155*b* of the driving transistor (T1) of the second pixel (PXb) further includes protrusions protruded to be electrically connected to the connecting member 176*b* through the opening formed in the third insulating layer 160. The second region of the second semiconductor 132*b* may include a portion that is removed so as to be electrically connected to the upper storage electrode 175*b* through the openings formed in the second insulating layer 140 and the third insulating layer 160. The upper storage electrode 175*b* may include a portion that is removed so as to be electrically connected to the lower storage electrode 125*b* through the openings formed in the first insulating layer 120, the second insulating layer 140, and the third insulating layer 160.

A border line of the gate electrode 155*b* of the driving transistor (T1) of the second pixel (PXb) may be positioned, except for the protrusion, to be further inside a border line of the lower storage electrode 125*b* overlapping the same and/or a border line of the upper to storage electrode 175*b* in a plan view. That is, in a plan view, the gate electrode 155*b* of the driving transistor (T1) has a first side that is a first-side side facing the gate electrode 155*c* of the adjacent driving transistor (T1), and the facing first side of the gate electrode 155*b* may be positioned inside a border of the lower storage electrode 125*b* and/or the upper storage electrode 175*b*. In a plan view, the gate electrode 155*b* of the driving transistor (T1) has a second side that a first-side side facing the gate electrode 155*a* of the adjacent driving transistor (T1), and the facing second side of the gate electrode 155*b* may be positioned inside a border of the lower storage electrode 125*b* and/or the upper storage electrode 175*b*. As a result, the gate electrode 155*b* of the driving transistor (T1) of the second pixel (PXb) forms a relatively small parasitic capacitance (refer to Cp of FIG. 5) with the adjacent pixels (PXa and PXc). That is, as shown in FIG. 4, the gate electrode 155*b* is protected by the lower storage electrode 125*b* and/or the upper storage electrode 175*b*, and the lower storage electrode 125*b* and/or the upper storage electrode 175*b* mainly forms parasitic capacitance with the adjacent pixels (PXa and PXc). This is because the the gate electrode 155*b* of the driving transistor (T1) of the second pixel (PXb) is covered by the lower storage electrode 125*b* and/or the upper storage electrode 175*b* positioned at the top and the bottom, and also because the same is connected to the lower storage electrode 125*b* and/or the upper storage electrode 175*b* before most of the generated power line enters the gate electrode 155*b*.

Referring to FIG. 2, the gate electrode 155*b* of the driving transistor (T1) of the second pixel (PXb) has a shape (a ⊏ shape) in which a first-side side of a portion overlapping the lower storage electrode 125*b* and the upper storage electrode 175*b* is opened, and a protrusion is positioned on the opened portion to connect the top and the bottom. The gate electrode 155*b* has a first portion including a first side facing the gate electrode 155*c* of the third pixel (PXc) and a second portion including a second side facing the gate electrode 155*a* of the first pixel (PXa), and a protrusion connects the first portion and the second portion.

According to the above-noted configuration, a gap among the connecting members 177*a*, 177*b*, and 177*c* of the three pixels is formed to be a maximum, and a disposal of the second semiconductors 132*a*, 132*b*, and 132*c* is formed to be a maximum distance apart. Particularly, referring to FIG. 2, the second semiconductor 132*a* included in the first pixel (PXa) is bent upward and is electrically connected to the connecting member 177*a*, and the second semiconductor 132*c* included in the third pixel (PXc) is bent downward and is electrically connected to the connecting member 177*c* so that they may be formed to be further apart. As described, according to the configuration in which the second semiconductors 132*a*, 132*b*, and 132*c* to which the data voltages (DVa, DVb, and DVc) are applied are distant from each other, and when the data voltages (DVa, DVb, and DVc) are input to the respective pixels (PXa, PXb, and PXc) at a same timing, they provide less influence to each other so that a sufficient voltage may be input to the storage capacitor (Cst). Particularly, this phenomenon may provide a greater influence when there is a large difference of the data voltages (DVa, DVb, and DVc) input to the respective pixels (PXa, PXb, and PXc), and when the second semiconductors 132a and 132c of the first pixel (PXa) and the third pixel (PXc) are bent to the outside and are positioned to be a maximum distance apart, as shown in FIG. 2, the influence may be minimized. The second semiconductors 132a and 132c of the first pixel (PXa) and the third pixel (PXc) are bent in the far direction from the second semiconductor 132b of the second pixel (PXb) and are connected to the connecting members 176a and 176c. In this instance, the second semiconductor 132b of the second pixel (PXb) is not bent and extends in the x-axis direction.

The gate electrode 155c of the driving transistor (T1) of the third pixel (PXc) includes a first portion overlapping the first semiconductor 131c and a second portion extending from the first portion, overlapping the lower storage electrode 125c and the upper storage electrode 175c, and configuring a second-side electrode of the storage capacitor (Cst). The gate electrode 155c of the driving transistor (T1) of the third pixel (PXc) includes a protrusion protruding to be electrically connected to the connecting member 176c through the opening formed in the third insulating layer 160. The second region of the first semiconductor 131c may include a portion that is removed so as to be electrically connected to the upper storage electrode 175c through the openings formed in the second insulating layer 140 and the third insulating layer 160. The upper storage electrode 175c may include a portion that is removed so as to be electrically connected to the lower storage electrode 125c through the openings formed in the first insulating layer 120, the second insulating layer 140, and the third insulating layer 160.

A border line of the gate electrode 155c of the driving transistor (T1) of the third pixel (PXc) may be positioned, except for the protrusion, to be further inside a border line of the lower storage electrode 125c overlapping the same and/or a border line of the upper storage electrode 175c in a plan view. That is, in a plan view, the gate electrode 155c of the driving transistor (T1) has a first side that is a first-side side facing the gate electrode 155b of the adjacent driving transistor (T1), and the facing first side of the gate electrode 155c may be positioned inside a border of the lower storage electrode 125c and/or the upper storage electrode 175c. As a result, the gate electrode 155c of the driving transistor (T1) of the third pixel (PXc) forms a relatively small parasitic capacitance (refer to Cp of FIG. 5) with the adjacent pixel (PXb). That is, similar to what is shown in FIG. 4, the gate electrode 155c is protected by the lower storage electrode 125c and/or the upper storage electrode 175c, so the lower storage electrode 125c and/or the upper storage electrode 175c mainly form a parasitic capacitance with the adjacent pixel (PXb). This is because the gate electrode 155c of the driving transistor (T1) of the third pixel (PXc) is covered by the lower storage electrode 125c and/or the upper storage electrode 175c positioned at the top and the bottom, and also because the same is connected to the lower storage electrode 125c and/or the upper storage electrode 175c before most of the generated power line enters the gate electrode 155c.

Depending on embodiments, one portion in addition to the protrusions of the gate electrodes 155a, 155b, and 155c may be positioned to be further outside a border line of the lower storage electrodes 125a, 125b, and 125c and/or the upper storage electrodes 175a, 175b, and 175c. When the gate electrodes 155a, 155b, and 155c are positioned to be further outside the border line of the lower storage electrodes 125a, 125b, and 125c and/or the upper storage electrodes 175a, 175b, and 175c, the storage capacitor (Cst) may have a desirable constant capacitance. That is, when the gate electrodes 155a, 155b, and 155c are actually formed, in the case in which they are formed while moving to one side, an area overlapping the lower storage electrodes 125a, 125b, and 125c and/or the upper storage electrodes 175a, 175b, and 175c is changed and capacitance of the storage capacitor (Cst) may be changed. However, when one portion of the gate electrodes 155a, 155b, and 155c is formed outside the lower storage electrodes 125a, 125b, and 125c and/or the upper storage electrodes 175a, 175b, and 175c, and the gate electrodes 155a, 155b, and 155c are formed while moving on one side, the area overlapping the lower storage electrodes 125a, 125b, and 125c and/or the upper storage electrodes 175a, 175b, and 175c may be maintained. To achieve this effect, the gate electrodes 155a, 155b, and 155c may further have a portion positioned outside the border line of the lower storage electrodes 125a, 125b, and 125c and/or the upper storage electrodes 175a, 175b, and 175c in addition to the protrusion.

Referring to FIG. 2, borders of the lower storage electrodes 125a, 125b, and 125c are positioned further outside than borders of the upper storage electrodes 175a, 175b, and 175c. That is, one sides of the lower storage electrodes 125a, 125b, and 125c corresponding to the first side on which the gate electrodes 155a, 155b, and 155c face each other are positioned further outside one side of the upper storage electrodes 175a, 175b, and 175c corresponding to the first side on which the gate electrodes 155a, 155b, and 155c face each other in a plan view. A gap among the lower storage electrodes 125a, 125b, and 125c facing each other and being adjacent to each other may be equal to or greater than 1 µm. A gap between the two sides, facing each other, of the lower storage electrodes 125a, 125b, and 125c corresponding to the first side on which the gate electrodes 155a, 155b, and 155c face each other, may be equal to or greater than 1 µm.

The input transistor (T2) has a channel, a first region, and a second region on the second semiconductors 132a, 132b, and 132c positioned on the first insulating layer 120, and the first region and the second region are doped and have the same or similar conductive characteristic. The first regions of the second semiconductors 132a, 132b, and 132c are electrically connected to the connecting members 177a, 177b, and 177c through the openings formed in the second insulating layer 140 and the third insulating layer 160, and the connecting members 177a, 177b, and 177c are electrically connected to the data lines 171a, 171b, and 171c through the openings formed in the first insulating layer 120, the second insulating layer 140, and the third insulating layer 160 to receive data voltages (DVa, DVb, and DVc). The second regions of the second semiconductors 132a, 132b, and 132c are electrically connected to the openings formed in the second insulating layer 140 and the third insulating layer 160 and the connecting members 176a, 176b, and 176c, and the connecting members 176a, 176b, and 176c are electrically connected to the gate electrodes 155a, 155b, and 155c through the opening formed in the third insulating layer 160. Depending on embodiments, the connecting members 176a, 176b, and 176c may extend toward the channels of the second semiconductors 132a, 132b, and 132c, and may cover the channels of the second semiconductors 132a, 132b, and 132c.

The second semiconductors 132a, 132b, and 132c are covered by the second insulating layer 140, and a gate electrode 156 is positioned on the second insulating layer 140. In a plan view, channels are formed on the second semiconductors 132a, 132b, and 132c overlapping the gate electrode 156, and the channels are covered by the gate electrode 156 and are not doped. The gate electrode 156 extends to pass through the opening formed in the third insulating layer 160 and is electrically connected to the first scan signal line 151 positioned on the third conductive layer.

The connecting members 177a, 177b, and 177c for connecting the first regions of the second semiconductors 132a, 132b, and 132c and the data lines 171a, 171b, and 171c have a symmetric configuration in one group of pixel circuit units.

That is, according to what is described with reference to FIG. 2, the second semiconductor 132a formed on the first pixel (PXa) is bent upward (or to the outside) in the y-axis direction and is connected to the connecting member 177a, and the second semiconductor 132c formed on the third pixel (PXc) is bent downward (or to the outside) in the y-axis direction and is connected to the connecting member 177c. In addition, the second semiconductor 132b formed on the second pixel (PXb) extends in the x-axis direction, is not bent in the y-axis direction, and is connected to the connecting member 177b. According to the above-described configuration, a disposal of the second semiconductors 132a, 132b, and 132c of three pixels is formed to be a maximum distance apart. According to the configuration in which the second semiconductors 132a, 132b, and 132c to which the data voltages (DVa, DVb, and DVc) are applied are positioned to be far apart from each other, when the data voltages (DVa, DVb, and DVc) are input to the respective pixels (PXa, PXb, and PXc) at the same timing, they provide less influence to each other so that a sufficient voltage may be input to the storage capacitor (Cst). Particularly, this phenomenon may provide a greater influence when there is a large difference of the data voltages (DVa, DVb, and DVc) input to the respective pixels (PXa, PXb, and PXc), and when the second semiconductors 132a and 132c of the first pixel (PXa) and the third pixel (PXc) are bent to the outside and are positioned to be far apart to the maximum as shown in FIG. 2, the influence may be minimized.

The initialization transistor (T3) has a channel, a first region, and a second region on the third semiconductors 133a, 133b, and 133c positioned on the first insulating layer 120, and the first region and the second region are doped and have a same or similar conductive characteristic as/to a conductor. The first regions of the third semiconductors 133a, 133b, and 133c are electrically connected to the upper storage electrodes 175a, 175b, and 175c positioned on the third conductive layer through the opening formed in the second insulating layer 140 and the third insulating layer 160. The upper storage electrodes 175a, 175b, and 175c are electrically connected to the lower storage electrodes 125a, 125b, and 125c through the openings formed in the first insulating layer 120, the second insulating layer 140, and the third insulating layer 160, and are electrically connected to the first semiconductors 131a, 131b, and 131c through the openings formed in the second insulating layer 140 and the third insulating layer 160. The second regions of the third semiconductors 133a, 133b, and 133c are electrically connected to the initialization voltage connector 173-3 through the openings formed in the second insulating layer 140 and the third insulating layer 160 to receive the initialization voltage (VINT). The third semiconductors 133a, 133b, and 133c are covered by the second insulating layer 140, and a gate electrode 157 is positioned on the second insulating layer 140. In a plan view, channels are formed on the third semiconductors 133a, 133b, and 133c overlapping the gate electrode 157, and the channels are covered by the gate electrode 157 and are not doped. The gate electrode 157 extends to pass through the opening formed in the third insulating layer 160 and is electrically connected to the second scan signal line 151-1 positioned on the third conductive layer.

As shown in FIG. 3, the storage capacitor (Cst) includes a storage capacitor 1 (Cst1) and a storage capacitor 2 (Cst2).

The storage capacitor 1 (Cst1) includes gate electrodes 155a, 155b, and 155c positioned on the second conductive layer, a third insulating layer 160 positioned thereon, and upper storage electrodes 175a, 175b, and 175c positioned thereon. The storage capacitor 2 (Cst2) includes lower storage electrodes 125a, 125b, and 125c positioned on the first conductive layer, a first insulating layer 120 and a second insulating layer 140 positioned thereon, and gate electrodes 155a, 155b, and 155c positioned thereon. As a result, the storage capacitor (Cst) has a triple-layer structure including gate electrodes 155a, 155b, and 155c in common, and two storage electrodes (upper storage electrodes 175a, 175b, and 175c and lower storage electrodes 125a, 125b, and 125c) overlapping top and bottom of the gate electrodes 155a, 155b, and 155c in a plan view.

The lower storage electrodes 125a, 125b, and 125c are electrically connected to the upper storage electrodes 175a, 175b, and 175c through the openings formed in the first insulating layer 120, the second insulating layer 140, and the third insulating layer 160, and the gate electrodes 155a, 155b, and 155c are included in common by the storage capacitor 1 (Cst1) and the storage capacitor 2 (Cst2), so the storage capacitor 1 (Cst1) and the storage capacitor 2 (Cst2) are coupled in parallel to each other according to a circuit structure. They have a structure coupled in parallel according to the circuit structure, so the entire capacitance of the storage capacitor (Cst) is a sum of values of capacitance of the storage capacitor 1 (Cst1) and capacitance of the storage capacitor 2 (Cst2).

The upper storage electrodes 175a, 175b, and 175c are integrally formed, and are electrically connected to anodes (not shown) of the light emitting diodes (EDa, EDb, and EDc) through openings 185a, 185b, and 185c formed in the fourth insulating layer 180. Depending on embodiments, an additional member (i.e., an anode connecting member) for connecting the upper storage electrodes 175a, 175b, and 175c and the anodes may be further included.

The light emitting diodes (EDa, EDb, and EDc) include an anode (refer to 191 of FIG. 21), an emission layer (refer to 370 of FIG. 21), and a cathode (refer to 270 of FIG. 21), and the anode is positioned on the fourth insulating layer 180. Additionally, a partition wall (refer to 350 of FIG. 21) may be formed to distinguish the light emitting diodes (LED), and the partition wall 350 may have a configuration in which the anode is exposed through the opening 351, the emission layer 370 is formed through the exposed portion, and the cathode 270 is formed thereon.

The emission layer may be formed in the opening of the partition wall depending on embodiments, and the emission layer 370 may be formed on the exposed anode 191 and the partition wall 350 according to an embodiment described with reference to FIG. 21. The cathode 270 is formed on the emission layer 370. According to an embodiment described with reference to FIG. 21, the emission layer 370 and the cathode 270 may be totally formed and may not use a mask.

An encapsulation layer, a color conversion layer, or a color filter may be included at the top of the light emitting diodes (EDa, EDb, and EDc), which will be described with reference to FIG. 21 later.

The structure of the pixels (PXa, PXb, and PXc) of a display device according to an embodiment has been described.

Interference between adjacent pixels may be considered by various types of parasitic capacitance, and parasitic capacitance (Cp) substantially considered in the present embodiment will be described with reference to FIG. 5.

Figure 5:
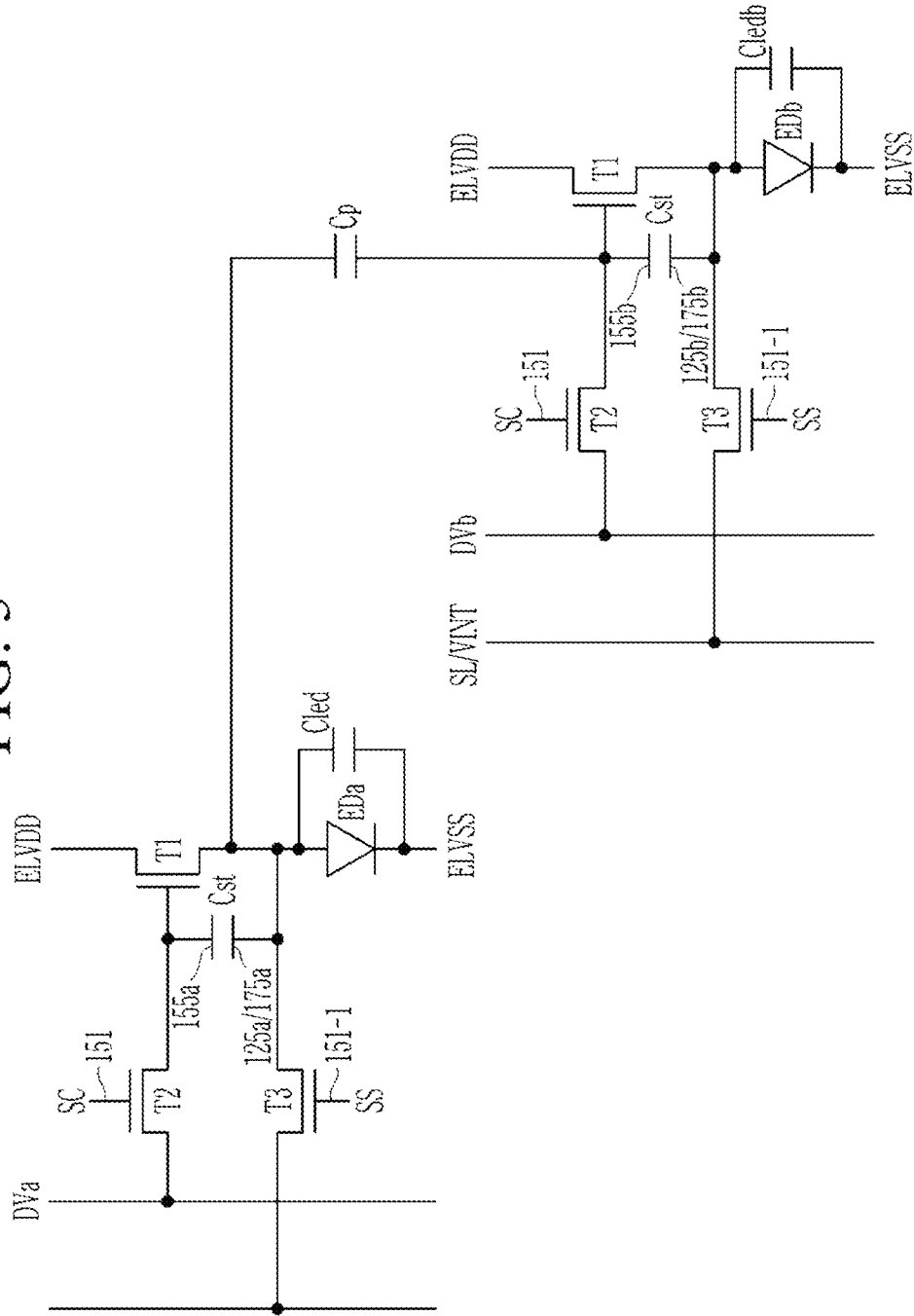
FIG. 5 illustrates a circuit diagram of a parasitic capacitance between pixels.

FIG. 5 shows a circuit diagram on a parasitic capacitor between pixels.

FIG. 5 mainly illustrates a first pixel (PXa) and a second pixel (PXb), and same parasitic capacitance (Cp) is formed between the second pixel (PXb) and the third pixel (PXc).

Referring to FIG. 5, a parasitic capacitance (Cp) for giving/receiving an influence to/from adjacent pixels is generated between an anode node of a first-side pixel (PXa) and a gate node of a second-side pixel (PXb).

Here, the anode node further includes a portion electrically connected to the anode and having a same voltage level as the anode, as well as anodes of the light emitting diodes (EDa, EDb, and EDc) positioned on the fourth insulating layer 180. That is, they include upper storage electrodes 175a, 175b, and 175c electrically connected to the anode through the openings 185a, 185b, and 185c formed in the fourth insulating layer 180, and lower storage electrodes 125a, 125b, and 125c electrically connected to the upper storage electrodes 175a, 175b, and 175c through the opening. The anode node may additionally include second regions of the first semiconductors 131a, 131b, and 131c and first regions of the third semiconductors 133a, 133b, and 133c additionally electrically connected to the upper storage electrodes 175a, 175b, and 175c through the openings.

The gate node further includes gate electrodes 155a, 155b, and 155c of the driving transistor (T1), and a portion electrically connected to the gate electrodes 155a, 155b, and 155c and having a same voltage level. That is, the gate node includes connecting members 176a, 176b, and 176c electrically connected to the protrusions of the gate electrodes 155a, 155b, and 155c through the opening formed in the third insulating layer 160. The gate node may additionally include second regions of the second semiconductors 132a, 132b, and 132c electrically connected to the connecting members 176a, 176b, and 176c through the opening.

When the gate node and the anode node are to be determined, the electrical connected state thereof may include an integrally formed case and a direct connection through an opening, and may not include a connection after passing through the channel of the semiconductor.

According to an embodiment described with reference to FIG. 2 to FIG. 4, the gate electrodes 155a, 155b, and 155c of the gate node for configuring the parasitic capacitance (Cp) are positioned on an inner side in a plan view and are protected compared to the lower storage electrodes 125a, 125b, and 125c and/or the upper storage electrodes 175a, 175b, and 175c positioned at the top and the bottom. As a result, the anode node of the adjacent pixel and the parasitic capacitance (Cp) are less formed, and the voltage at the gate node of the present pixel is influenced less by the anode node of the adjacent pixel. The voltage at the gate node of the present pixel may be sufficiently charged according to the data voltage of the present pixel, and the driving transistor may output an appropriate output current to the anode of the light emitting diode (LED). Hence, the light emitting diode (LED) may emit light with desired luminance, and display quality is not deteriorated.

An embodiment in which parasitic capacitance (Cp) is much less formed on protrusions of the gate electrodes 155a, 155b, and 155c by using the lower storage electrodes 125a, 125b, and 125c or the upper storage electrodes 175a, 175b, and 175c will now be described with reference to FIG. 6 to FIG. 9.

Differing from an embodiment described with reference to FIG. 2 to FIG. 4, regarding an embodiment described with reference to FIG. 6 to FIG. 9, a protrusion of the gate electrode 155b of the second pixel (PXb) is positioned at the top, and configurations of the lower storage electrode 125b and the upper storage electrode 175b are resultantly different.

A configuration in which an expansion is further formed on the lower storage electrode 125b of the second pixel (PXb) to protect the gate electrode 155b will now be described with reference to FIG. 6 and FIG. 7.

Figure 6:
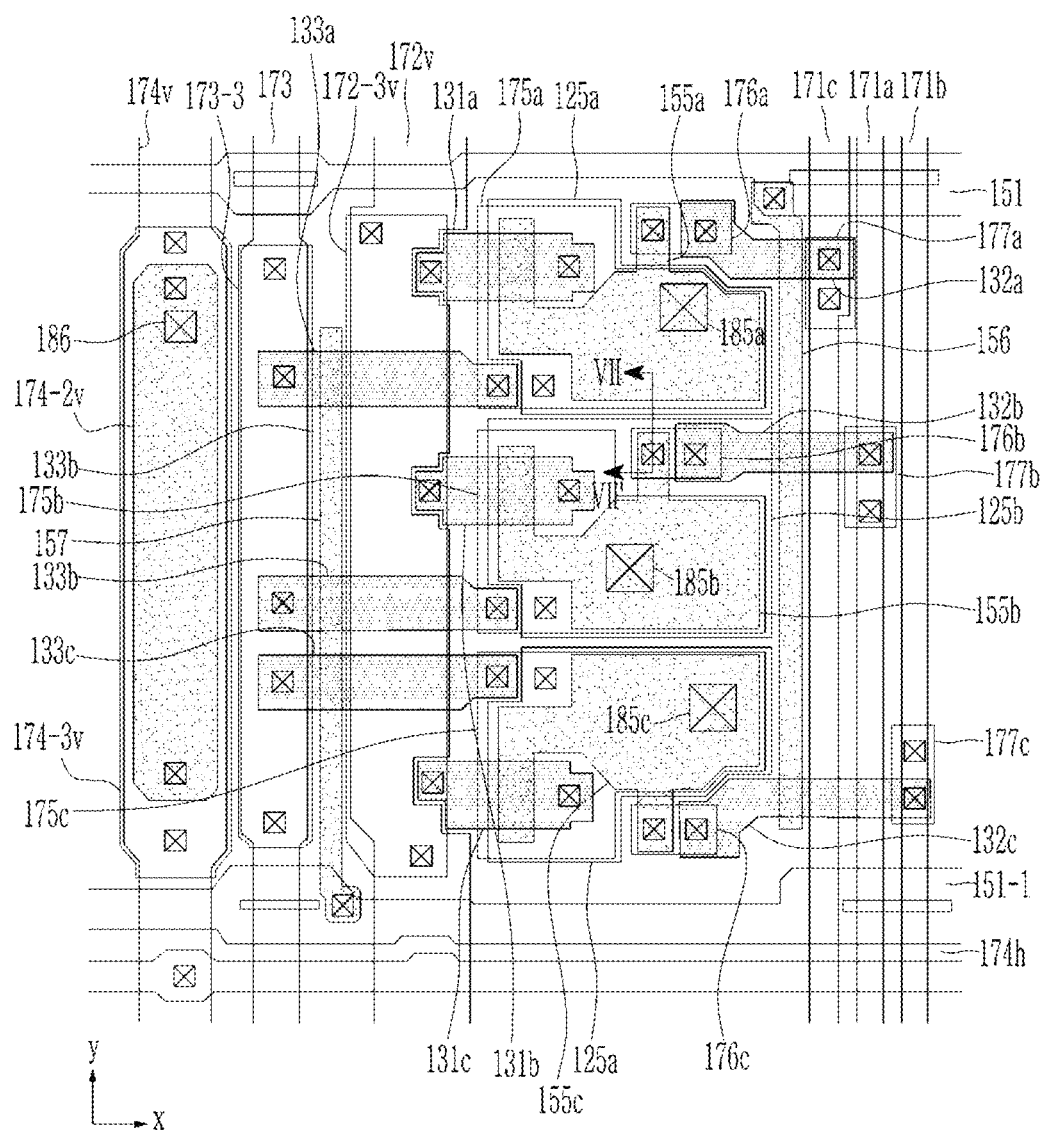
FIG. 6 illustrates a top plan view of part of a light emitting display device according to another embodiment.
Figure 7:
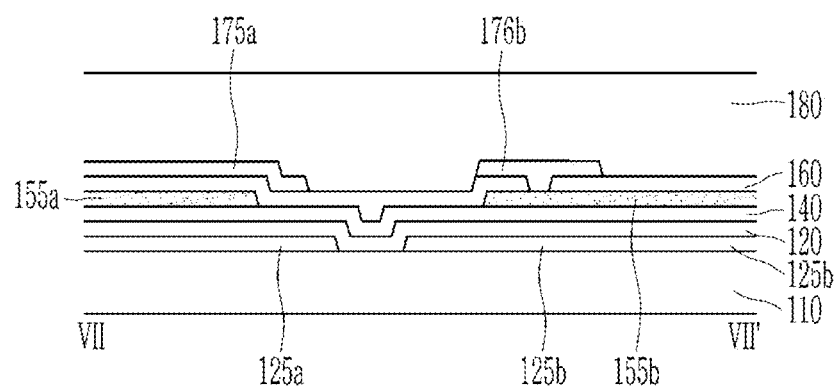
FIG. 7 illustrates a cross-sectional view of a light emitting display device is according to an embodiment with respect to a line VII-VII' of FIG. 6.

FIG. 6 shows a top plan view of part of a light emitting display device according to another embodiment, and FIG. 7 shows a cross-sectional view of a light emitting display device according to an embodiment with respect to a line VI-VI of FIG. 6.

Shapes of the gate electrode 155b, the lower storage electrode 125b, and the upper storage electrode 175b included in the second pixel (PXb) positioned in the center of FIG. 6 correspond to the shapes of the gate electrode 155a, the lower storage electrode 125a, and the upper storage electrode 175a included in the first pixel (PXa). As a result, the protrusion of the gate electrode 155b included in the second pixel (PXb) is not formed in an opened portion of the gate electrode as shown in FIG. 2, but it has a structure that protrudes upward in a manner similar to that of the gate electrode 155a of the first pixel (PXa). Depending on embodiments, the protrusion of the gate electrode 155b included in the second pixel (PXb) may protrude downward in a manner similar to that of the gate electrode 155b of the third pixel (PXc).

Referring to FIG. 6, the lower storage electrode 125b further includes an expansion positioned below the second semiconductor 132b and the protrusion of the gate electrode 155b in a plan view. As a result, a border line of the gate electrode 155b of the driving transistor (T1) of the second pixel (PXb) may include a protrusion, and may be positioned further inside the border line of the lower storage electrode 125b in a plan view. According to the above-noted structure, in addition to the embodiment described according to FIG. 2 to FIG. 4, the former border line is positioned inside the border line of the lower storage electrode 125b up to the protrusion of the gate electrode 155b, so before a predetermined amount of generated power lines are input to the gate electrode 155b, they are connected to the lower storage electrode 125b, and the gate electrode 155b of the driving transistor (T1) of the second pixel (PXb) forms relatively small parasitic capacitance with adjacent pixels (PXa).

Referring to FIG. 6, the second semiconductor 132b extends in the x-axis direction, and is not bent in the y-axis direction. However, compared to the embodiment described with reference to FIG. 2, the second semiconductor 132b is positioned nearer the first pixel (PXa) than the third pixel (PXc), so the parasitic capacitance (Cp) with the first pixel (PXa) may be relatively large, but the second semiconductor 132b may be protected up to the protrusion of the gate electrode 155b by the expansion of the additional lower storage electrode 125b, thereby additionally reducing the parasitic capacitance (Cp) of the first pixel (PXa) and maintaining the balance.

In this instance, in a manner similar to that of the embodiment described with reference to FIG. 2, in an embodiment described with reference to FIG. 6, the second semiconductor 132a included in the first pixel (PXa) is bent upward and is electrically connected to the connecting member 177a, and the second semiconductor 132c included in the third pixel (PXc) is bent downward and is electrically connected to the connecting member 177c to thus be formed to be farther apart from the second semiconductor 132a included in the first pixel (PXa). The second semiconductors 132a and 132c of the first pixel (PXa) and the third pixel (PXc) are bent starting from the second semiconductor 132b of the second pixel (PXb) in the far direction and are connected to the connecting members 176a and 176c. In this instance, the second semiconductor 132b of the second pixel (PXb) is not bent but extends in the x-axis direction. As a result, an influence generated when the data voltage is applied to the second pixel (PXb) from the first pixel (PXa) and the third pixel (PXc) may be minimized.

Referring to FIG. 6 and FIG. 7, borders of the lower storage electrodes 125a, 125b, and 125c are positioned outside of borders of the upper storage electrodes 175a, 175b, and 175c in a plan view. The gap among the adjacent lower storage electrodes 125a, 125b, and 125c may be equal to or greater than 1 µm.

Referring to FIG. 6, the border line of the gate electrodes 155a, 155b, and 155c may be positioned further inside than the border line of the upper storage electrodes 175a, 175b, and 175c except for the protrusion in a plan view. However, depending on embodiments, the gate electrodes 155a, 155b, and 155c may be positioned further inside the border line of the upper storage electrodes 175a, 175b, and 175c and/or the lower storage electrodes 125a, 125b, and 125c on a predetermined portion except for the protrusion of the gate electrodes 155a, 155b, and 155c. When the gate electrodes 155a, 155b, and 155c are positioned further outside than the border line of the upper storage electrodes 175a, 175b, and 175c and/or the lower storage electrodes 125a, 125b, and 125c, capacitance of the storage capacitor (Cst) may desirably become constant.

However, depending on embodiments, the expansion overlapping the second semiconductor 132b and the protrusion of the gate electrode 155b in a plan view may be positioned not on the lower storage electrode but on the upper storage electrode. In this instance, the connecting member 126b for connecting the second semiconductor 132b and the gate electrode 155b may be positioned on the first conductive layer. This will now be described with reference to FIG. 8 and FIG. 9.

Figure 8:
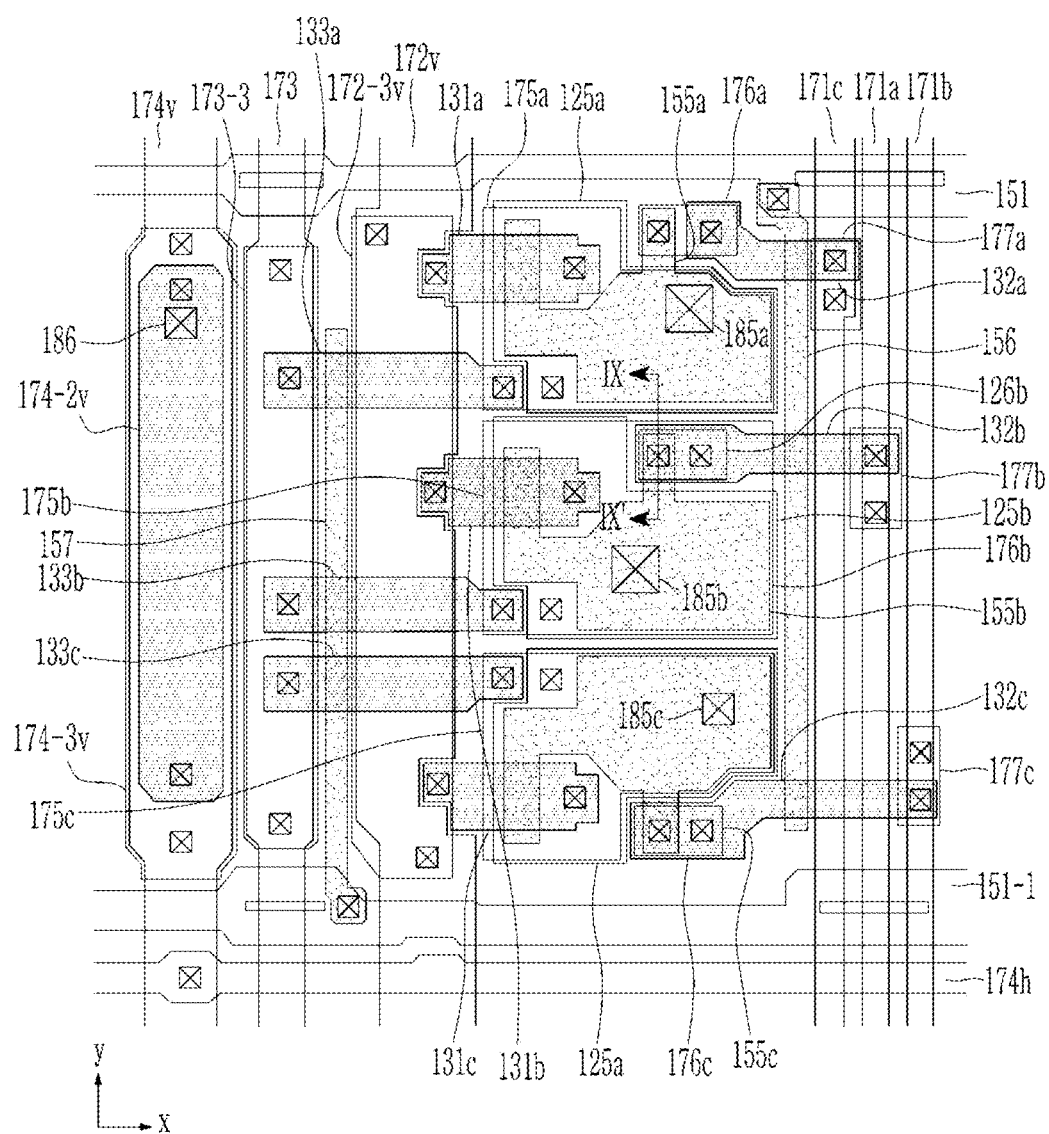
FIG. 8 illustrates a top plan view of part of a light emitting display device according to another embodiment.
Figure 9:
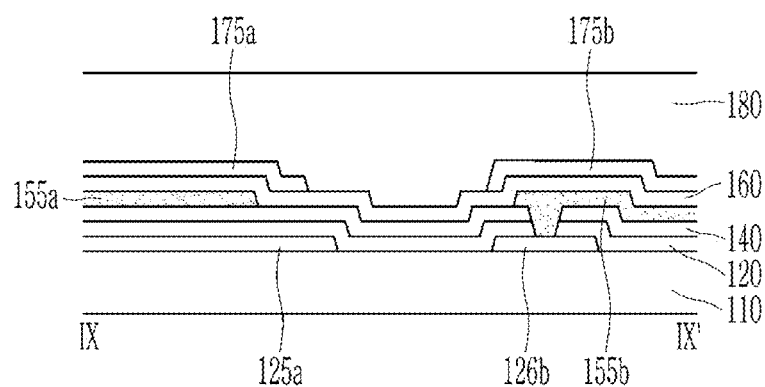
FIG. 9 illustrates a cross-sectional view of a light emitting display device according to an embodiment with respect to a line IX-IX' of FIG. 8.

FIG. 8 shows a top plan view of part of a light emitting display device according to another embodiment, and FIG. 9 shows a cross-sectional view of a light emitting display device according to an embodiment with respect to a line IX-IX of FIG. 8.

The shapes of the gate electrode 155b, the lower storage electrode 125b, and the upper storage electrode 175b included in the second pixel (PXb) positioned in the center in FIG. 8 may correspond to the shapes of the gate electrode 155a, the lower storage electrode 125a, and the upper storage electrode 175a included in the first pixel (PXa). As a result, the protrusion of the gate electrode 155b included in the second pixel (PXb) is not formed in the opened portion of the gate electrode as shown in FIG. 2, but it instead protrudes upward in a manner similar to that of the gate electrode 155a of the first pixel (PXa). Depending on embodiments, the protrusion of the gate electrode 155b included in the second pixel (PXb) may protrude downward in a manner similar to that of the gate electrode 155b of the third pixel (PXc).

Referring to FIG. 8, the upper storage electrode 175b further includes an expansion positioned on the second semiconductor 132b and the protrusion of the gate electrode 155b in a plan view. As a result, the border line of the gate electrode 155b of the driving transistor (T1) of the second pixel (PXb) may include a protrusion and may be positioned further inside than the border line of the upper storage electrode 175b in a plan view. According to the above-noted structure, in addition to the embodiment described with reference to FIG. 2 to FIG. 4, the protrusion of the gate electrode 155b is also positioned inside the border line of the upper storage electrode 175b up to the protrusion of the gate electrode 155b, so before a predetermined amount of generated power lines are input to the gate electrode 155b, they are connected to the upper storage electrode 175b, and the gate electrode 155b of the driving transistor (T1) of the second pixel (PXb) forms a relatively small parasitic capacitance with adjacent pixels (PXa).

Referring to FIG. 8, the second semiconductor 132b extends in the x-axis direction, and is not bent in the y-axis direction. However, compared to the embodiment described with reference to FIG. 2, the second semiconductor 132b is positioned nearer the first pixel (PXa) than the third pixel (PXc), so the parasitic capacitance (Cp) with the first pixel (PXa) may be relatively large, but the second semiconductor 132b may be protected up to the protrusion of the gate electrode 155b by the expansion of the additional upper storage electrode 175b, thereby additionally reducing the parasitic capacitance (Cp) of the first pixel (PXa) and maintaining the balance.

In this instance, in a manner similar to that of the embodiment described with reference to FIG. 2, in an embodiment described with reference to FIG. 8, the second semiconductor 132a included in the first pixel (PXa) is bent upward and is electrically connected to the connecting member 177a, and the second semiconductor 132c included in the third pixel (PXc) is bent downward and is electrically connected to the connecting member 177c to thus be formed to be farther apart from the second semiconductor 132a included in the first pixel (PXa). The second semiconductors 132a and 132c of the first pixel (PXa) and the third pixel (PXc) are bent starting from the second semiconductor 132b of the second pixel (PXb) in the far direction and are connected to the connecting members 176a and 176c. In this instance, the second semiconductor 132b of the second pixel (PXb) is not bent but extends in the x-axis direction. As a result, an influence generated when the data voltage is applied to the second pixel (PXb) from the first pixel (PXa) and the third pixel (PXc) may be minimized.

Referring to FIG. 8 and FIG. 9, the border is positioned further outside the lower storage electrodes 125a, 125b, and 125c than the upper storage electrodes 175a, 175b, and 175c except for the expansion of the upper storage electrodes 175a, 175b, and 175c. The gap among the adjacent lower storage electrodes 125a, 125b, and 125c may be equal to or greater than 1 µm, and depending on embodiments, the gap among the lower storage electrodes 125a, 125b, and 125c or the upper storage electrodes 175a, 175b, and 175c provided near the expansion of the upper storage electrodes 175a, 175b, and 175c may be equal to or greater than 1 µm.

Referring to FIG. 8, the border line of the gate electrodes 155a, 155b, and 155c may be positioned further inside than the border line of the lower storage electrodes 125a, 125b, and 125c except for the protrusion in a plan view. However, depending on embodiments, the gate electrodes 155a, 155b, and 155c may be positioned further inside the border line of the upper storage electrodes 175a, 175b, and 175c and/or the lower storage electrodes 125a, 125b, and 125c on a predetermined portion except for the protrusion of the gate electrodes 155a, 155b, and 155c. When the gate electrodes 155a, 155b, and 155c are positioned further outside than the border line of the upper storage electrodes 175a, 175b, and 175c and/or the lower storage electrodes 125a, 125b, and 125c, capacitance of the storage capacitor (Cst) may desirably become constant.

According to an embodiment described with reference to FIG. 8 and FIG. 9, the connecting member 126b for connecting the second semiconductor 132b and the gate electrode 155b on the second pixel (PXb) is positioned on the first conductive layer, so it may be positioned on the same layer with the same material as the lower storage electrodes 125a, 125b, and 125c. That is, the second semiconductor 132b may be electrically connected to the connecting member 126b positioned on the first conductive layer through the opening formed in the first insulating layer 120, and the connecting member 126b may be electrically connected to the protrusion of the gate electrode 155b through the opening formed in the first insulating layer 120 and the second insulating layer 140.

An embodiment to which at least one of the following characteristics is applied so as to reduce the parasitic capacitance (Cp) between adjacent pixels has been described with reference to FIG. 2 to FIG. 9.

To reduce the parasitic capacitance (Cp) among the adjacent pixels according to an embodiment described with reference to FIG. 2 to FIG. 9, the border line of the gate electrode of the driving transistor (T1) may be positioned further inside than the border line of the lower storage electrode and/or the border line of the upper storage electrode in a plan view. In this instance, part (e.g., protrusions, etc.,) from among the gate electrode of the driving transistor (T1) may be positioned further outside the border line of the lower storage electrode and/or the border line of the upper storage electrode in a plan view.

According to an embodiment described with reference to FIG. 2 to FIG. 9, to reduce the parasitic capacitance (Cp) among adjacent pixels, a portion overlapping the lower storage electrode 125b and the upper storage electrode 175b has a shape (a ⌐ shape) in which a first-side side is opened from among the gate electrode 155b of the driving transistor (T1) of the pixel positioned in the center, and a protrusion is positioned on the opened portion to connect the top and the bottom. According to the above-noted configuration, a gap among the connecting members 177a, 177b, and 177c of the three pixels is formed to be maximized.

According to an embodiment described with reference to FIG. 2 to FIG. 9, to reduce the parasitic capacitance (Cp) among the adjacent pixels, the second semiconductor 132a included in the first pixel (PXa) is bent upward and is electrically connected to the connecting member 177a, and the second semiconductor 132c included in the third pixel (PXc) is bent downward and is electrically connected to the connecting member 177c. The second semiconductor 132b included in the second pixel (PXb) may extend in the x-axis direction and may not be bent in the y-axis direction. As a result, the second semiconductors 132a, 132b, and 132c are disposed to be separated from each other by a maximum distance.

According to an embodiment described with reference to FIG. 2 to FIG. 9, the gap among the constituent elements of the adjacent pixels may be formed to be equal to or greater than at least 1 μm so as to reduce the parasitic capacitance (Cp) among the adjacent pixels. According to an embodiment described with reference to FIG. 2 to FIG. 9, the gap among the adjacent lower storage electrodes 125a, 125b, and 125c may be equal to or greater than 1 μm, and depending on embodiments, the gap among the lower storage electrodes 125a, 125b, and 125c or the upper storage electrodes 175a, 175b, and 175c provided near the expansion of the upper storage electrodes 175a, 175b, and 175c may be equal to or greater than 1 μm.

An embodiment in which an interference rate among adjacent pixels is defined (refer to Equation 1), and a value of the corresponding interference rate is set to be less than a predetermined level to reduce parasitic capacitance (Cp) among adjacent pixels, will now be described with reference to FIG. 10 to FIG. 18.

A configuration of a pixel circuit unit of one group of pixels (PXa, PXb, and PXc) according to an embodiment will now be described with reference to FIG. 10.

Figure 10:
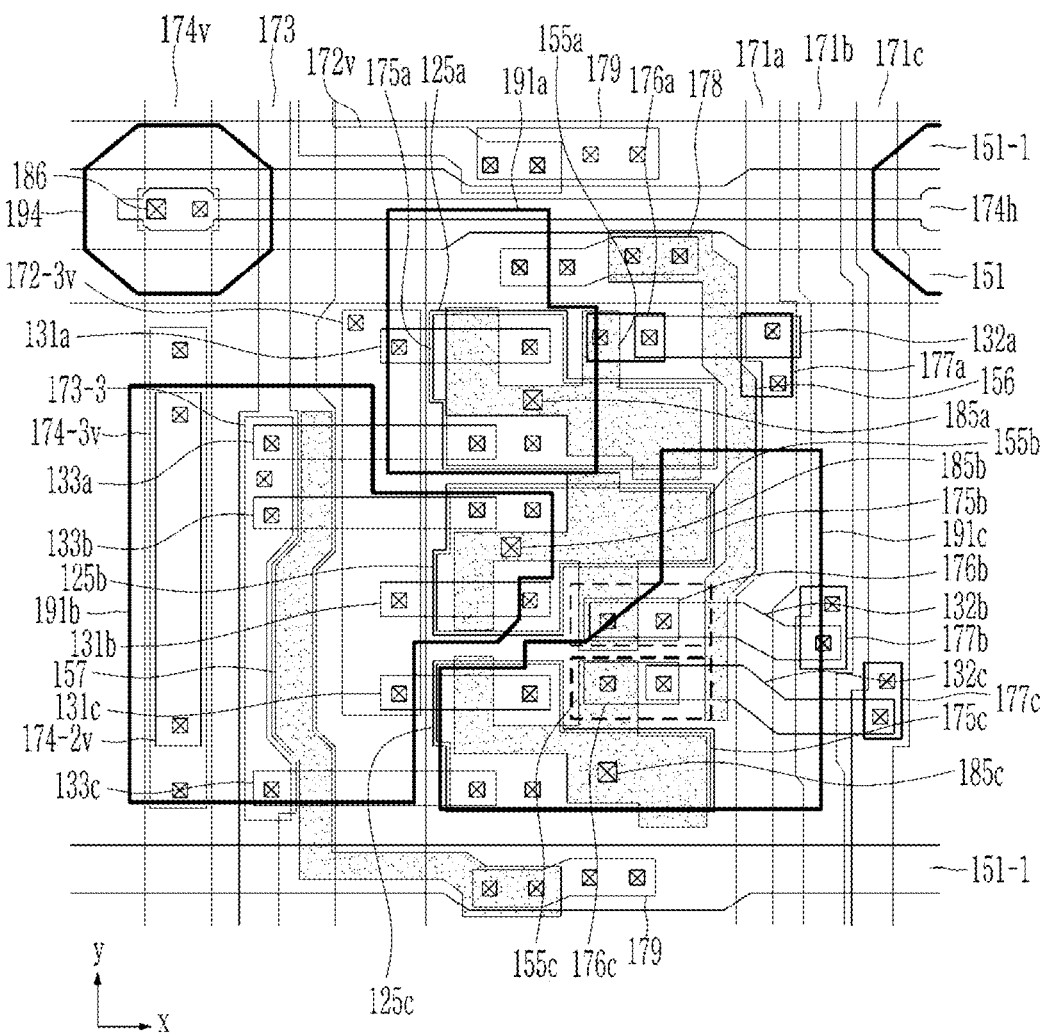
FIG. 10 illustrates a top plan view of part of a light emitting display device according to another embodiment.

FIG. 10 shows a top plan view of part of a light emitting display device according to another embodiment.

An embodiment described with reference to FIG. 10 adds anodes 191a, 191b, and 191c and a cathode connector 194 positioned on the fourth insulating layer 180, differing from what is described with reference to FIG. 2 to FIG. 9. A detailed configuration given in FIG. 10 will now be described.

As shown in FIG. 10, the respective pixel circuit units are arranged in the y-axis direction, and in detail, the first pixel circuit unit belonging to the first pixel (PXa) is positioned at the top, the second pixel circuit unit belonging to the second pixel (PXb) is positioned below the same, and the third pixel circuit unit belonging to the third pixel (PXc) is positioned at the bottom.

The embodiment described with reference to FIG. 10 may also have a stacking structure given below in a like manner of what is described with reference to FIG. 2 to FIG. 4.

Figure 13:
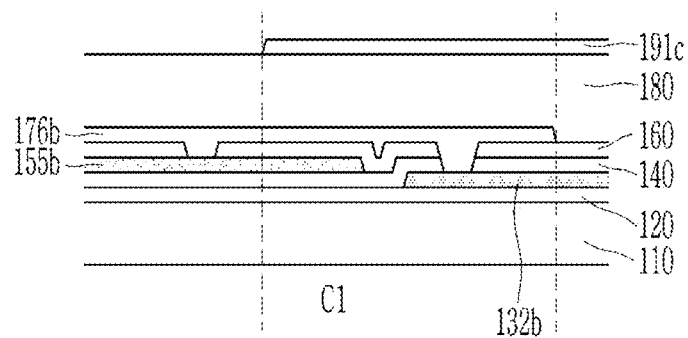
FIG. 13 illustrates a cross-sectional view of a first capacitor between adjacent pixels according to an embodiment.
Figure 18:
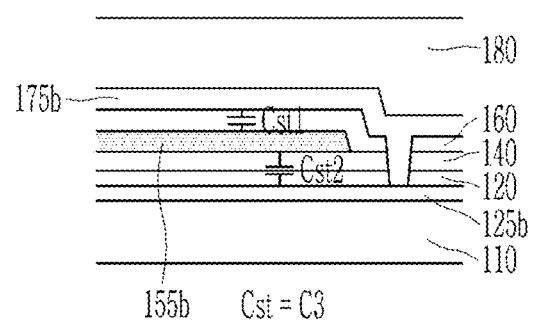
FIG. 18 illustrates a cross-sectional view of a storage capacitor of one pixel according to an embodiment.

Referring to FIG. 13 and FIG. 18, the light emitting display device according to an embodiment of FIG. 10 may include a substrate 110, and the substrate 110 may include an insulating material, such as glass or plastic, and may have flexibility.

A first conductive layer, a first insulating layer 120, a semiconductor layer, a second insulating layer 140, a second conductive layer, a third insulating layer 160, a third conductive layer, and a fourth insulating layer 180 are sequentially positioned on the substrate 110, and a fourth conductive layer including anodes 191a, 191b, and 191c and a cathode connector 194 is positioned on the fourth insulating layer 180. Here, the first insulating layer 120, the second insulating layer 140, and the third insulating layer 160 may be inorganic insulating layers including inorganic insulating materials, and the fourth insulating layer 180 may be an organic insulating layer including an organic insulating material. Depending on embodiments, the respective insulating layers may be made of a plurality of layers, and depending on embodiments, the third insulating layer 160 may be an organic insulating layer. Here, the inorganic insulating material may include a silicon nitride ($SiN_x$), a silicon oxide ($SiO_x$), and a silicon oxynitride (SiON), and the organic insulating material may include a polyimide, an acryl-based polymer, and a siloxane-based polymer. Further, the first conductive layer, the second conductive layer, and the third conductive layer may include at least one of metals including copper (Cu), aluminum (Al), magnesium (Mg), silver (Ag), gold (Au), platinum (Pt), palladium (Pd), nickel (Ni), neodynium (Nd), iridium (Ir), molybdenum (Mo), tungsten (W), titanium (Ti), chromium (Cr), tantalum (Ta), and an alloy thereof. The first conductive layer, the second conductive layer, and the third conductive layer may respectively be made of a single layer or a multilayer. For example, they may have a multilayered structure including a lower layer having titanium and an upper layer having copper. The fourth conductive layer may include the same material as the first conductive layer, the second conductive layer, and the third conductive layer, may be formed to be a single layer or a multilayer, and may additionally include a transparent conductive material. In addition, the semiconductor layer may include a semiconductor material, such as amorphous silicon, polysilicon, or an oxide semiconductor. In the present embodiment, the semiconductor layer including an oxide semiconductor will be mainly described.

Respective constituent elements included in the pixel circuit unit from among one group of pixels will now be described in detail with reference to FIG. 10, FIG. 13, and FIG. 18.

The first scan signal line 151 extends in the x-axis direction, and one first scan signal line 151 is formed for each group of pixel circuit units and is formed on the third conductive layer as a single layer. The second scan signal line 151-1 extends in the x-axis direction, and one second scan signal line 151-1 is formed for each group of pixel circuit units and is formed on the third conductive layer as a single layer. Depending on embodiments, the first scan signal line 151 and the second scan signal line 151-1 may be formed of a plurality of layers, such as double layers.

The first scan signal line 151 is electrically connected to the gate electrode 156 positioned on the second conductive layer. Referring to FIG. 10, the first scan signal line 151 positioned on the third conductive layer may be electrically connected to the connecting member 178 positioned on the first conductive layer through the openings formed in the first insulating layer 120, the second insulating layer 140, and the third insulating layer 160, and the connecting member 178 may be electrically connected to the gate electrode 156 through the openings formed in the first insulating layer 120 and the second insulating layer 140. The first scan signal (SC) is transmitted through the first scan signal line 151, and it controls a plurality of input transistors T2 included in one group of pixel circuit units through the gate electrode 156 electrically connected to the first scan signal line 151.

The second scan signal line 151-1 is electrically connected to the gate electrode 157 positioned on the second conductive layer. Referring to FIG. 10, the second scan signal line 151-1 positioned on the third conductive layer may be electrically connected to the connecting member 179 positioned on the first conductive layer through the openings formed in the first insulating layer 120, the second insulating layer 140, and the third insulating layer 160, and the connecting member 179 may be electrically connected to the gate electrode 157 through the openings formed in the first insulating layer 120 and the second insulating layer 140. A second scan signal (SS) is transmitted through the second scan signal line 151-1, and it controls a plurality of initialization transistors (T3) included in one group of pixel circuit units through the gate electrode 157 electrically connected to the second scan signal line 151-1.

The data lines 171a, 171b, and 171c extend in the y-axis direction, and the three data lines 171a, 171b, and 171c are positioned on one side (e.g., the right side in FIG. 2) of the pixel circuit unit. The data lines 171a, 171b, and 171c have a single-layer structure, and are formed on the first conductive layer. They may be formed to have a plurality of layers depending on embodiments.

The data lines 171a, 171b, and 171c are electrically connected to the second semiconductors 132a, 132b, and 132c through the connecting members 177a, 177b, and 177c positioned on the third conductive layer. Referring to FIG. 10, the connecting members 177a, 177b, and 177c positioned on the third conductive layer may be electrically connected to the data lines 171a, 171b, and 171c positioned on the first conductive layer through the openings formed in the first insulating layer 120, the second insulating layer 140, and the third insulating layer 160, and the connecting members 177a, 177b, and 177c may be electrically connected to the second semiconductors 132a, 132b, and 132c through the openings formed in the second insulating layer 140 and the third insulating layer 160.

When the three pixels (PXa, PXb, and PXc) belonging to one group of pixels are controlled by one first scan signal line 151 according to the above-described configuration, they may receive different data voltages (DVa, DVb, and DVc) through the data lines 171a, 171b, and 171c. As a result, the respective light emitting diodes (EDa, EDb, and EDc) belonging to the respective pixels (PXa, PXb, and PXc) may display different values of luminance.

The driving voltage line 172 for transmitting a driving voltage (ELVDD) may include a driving voltage line 172v extending in the y-axis direction and an additional driving voltage line (not shown) extending in the x-axis direction. The additional driving voltage line (not shown) may be positioned on the third conductive layer in a like manner of the additional driving low voltage line 174h to be described. That is, according to the above-described embodiment, the driving voltage line 172v positioned on the first conductive layer may be electrically connected to the additional driving voltage line (not shown) positioned on the third conductive layer through the openings formed in the first insulating layer 120, the second insulating layer 140, and the third insulating layer 160. Reduction of the voltage value of the driving voltage (ELVDD) at a specific position may be prevented by transmitting the driving voltage (ELVDD) in the x-axis and y-axis directions.

According to the embodiment described with reference to FIG. 10, the driving voltage line 172v extending in the y-axis direction is formed of the first conductive layer, and it has a double-layer structure at a predetermined section. That is, a driving voltage connector (172-3v) positioned on the third conductive layer is further included on the driving voltage line 172v positioned on the the first conductive layer. The driving voltage connector (172-3v) is electrically connected to the driving voltage line 172v through the openings formed in the first insulating layer 120, the second insulating layer 140, and the third insulating layer 160, and the driving voltage (ELVDD) is transmitted to the double layers of the driving voltage line 172v and the driving voltage connector (172-3v), thereby desirably reducing wire resistance. The driving voltage connector (172-3v) electrically connects the driving voltage line 172v and the first semiconductors 131a, 131b, and 131c through the openings formed in the second insulating layer 140 and the third insulating layer 160 so that the driving voltage (ELVDD) may be transmitted to the first semiconductors 131a, 131b, and 131c.

The initialization voltage line 173 for transmitting an initialization voltage (VINT) is positioned on the left of the pixel circuit unit, it is positioned on the first conductive layer, and it extends in the y-axis direction. The initialization voltage line 173 includes a section with a double-layer structure. That is, an initialization voltage connector 173-3 positioned on the third conductive layer is further included on the initialization voltage line 173 positioned on the first conductive layer. The initialization voltage connector 173-3 is electrically connected to the initialization voltage line 173 through the openings formed in the first insulating layer 120, the second insulating layer 140, and the third insulating layer 160. The initialization voltage (VINT) is transmitted to the double layer of the initialization voltage line 173 and the initialization voltage connector 173-3 for a predetermined section, so the wire resistance is reduced as a merit. The initialization voltage connector 173-3 is electrically connected to the third semiconductors 133a, 133b, and 133c through the openings formed in the second insulating layer 140 and the third insulating layer 160 so that the initialization voltage (VINT) may be transmitted to the third semiconductors 133a, 133b, and 133c.

A driving low voltage line 174 for transmitting the driving low voltage (ELVSS) applied to cathodes (refer to 270 of FIG. 21) of the light emitting diodes (EDa, EDb, and EDc) is formed on the pixel circuit unit.

The driving low voltage line 174 for transmitting the driving low voltage (ELVSS) may include a driving low voltage line 174v extending in the y-axis direction and an additional driving low voltage line 174h extending in the x-axis direction. The driving low voltage line 174v positioned on the first conductive layer is electrically connected to the additional driving low voltage line 174h positioned on the third conductive layer through the openings formed in the first insulating layer 120, the second insulating layer 140, and the third insulating layer 160. A reduction of the voltage value of the driving low voltage (ELVSS) at a specific position may be prevented by transmitting the driving low voltage (ELVSS) in the x-axis and y-axis directions.

The driving low voltage line 174v includes a section having a triple-layer structure. That is, a portion (174-2v) positioned on the second conductive layer and a portion (174-3v) positioned on the third conductive layer are electrically connected to each other through the opening on the driving low voltage line 174v positioned on the first conductive layer. In detail, the driving low voltage line 174v is electrically connected to the portion (174-3v) positioned on the third conductive layer through the openings formed in the first insulating layer 120, the second insulating layer 140, and the third insulating layer 160, and the portion (174-3v) positioned on the third conductive layer is electrically connected to the portion (174-2v) positioned on the second conductive layer through the opening formed in the third insulating layer 160. In the above-noted embodiment, the driving low voltage line 174v positioned on the first conductive layer and the portion (174-2v) positioned on the second conductive layer may not be directly connected to each other, and may be connected through the portion (174-3v) positioned on the third conductive layer. According to the triple-layer structure, the driving low voltage (ELVSS) is transmitted to the triple layer, so wire resistance is reduced as a merit.

The additional driving low voltage line 174h positioned on the third conductive layer is electrically connected to the cathode connector 194 positioned on the fourth conductive layer by the opening 186 positioned in the fourth insulating layer 180. The cathode connector 194 is electrically connected to the cathodes (refer to 270 of FIG. 21) of the light emitting diodes (EDa, EDb, and EDc), and the driving low voltage (ELVSS) is transmitted to the cathodes.

Referring to FIG. 1, the driving low voltage (ELVSS) may be applied to the one-side electrode of the emitter capacitor.

A plurality of transistors (T1, T2, and T3) have a same stacking structure, and include a channel positioned on the gate electrode positioned on the second conductive layer and the semiconductor layer, and a first region and a second region positioned on respective sides of the channel and doped to have a same/similar characteristic to a conductive material. Here, the first region and the second region positioned on the semiconductor layer may correspond to the first electrode and the second electrode described with reference to FIG. 1.

The respective transistors will now be described in detail.

The driving transistor (T1) has a channel, a first region, and a second region on the first semiconductors 131a, 131b, and 131c positioned on the first insulating layer 120, and the first region and the second region are doped to have a same or similar conductive characteristic as/to a conductor. The first regions of the first semiconductors 131a, 131b, and 131c are electrically connected to the driving voltage line 172v through the opening and the driving voltage connector (172-3v) to receive the driving voltage (ELVDD). In detail, the driving voltage line 172v is connected to the driving voltage connector (172-3v) through the openings formed in the first insulating layer 120, the second insulating layer 140, and the third insulating layer 160, and the driving voltage connector (172-3v) is electrically connected to the first semiconductors 131a, 131b, and 131c through the openings formed in the second insulating layer 140 and the third insulating layer 160. The second regions of the first semiconductors 131a, 131b, and 131c are electrically connected to the upper storage electrodes 175a, 175b, and 175c through the openings formed in the second insulating layer 140 and the third insulating layer 160. The upper storage electrodes 175a, 175b, and 175c are electrically connected to the lower storage electrodes 125a, 125b, and 125c through the openings formed in the first insulating layer 120, the second insulating layer 140, and the third insulating layer 160, and are electrically connected to the third semiconductors 133a, 133b, and 133c through the openings formed in the second insulating layer 140 and the third insulating layer 160. As a result, the first semiconductors 131a, 131b, and 131c are electrically connected to the lower storage electrodes 125a, 125b, and 125c and the first regions of the third semiconductors 133a, 133b, and 133c.

The first semiconductors 131a, 131b, and 131c are covered by the second insulating layer 140, and gate electrodes 155a, 155b, and 155c are formed on the second insulating layer 140. In a plan view, a channel is formed on the first semiconductors 131a, 131b, and 131c overlapping the gate electrodes 155a, 155b, and 155c, and the channel is covered by the gate electrodes 155a, 155b, and 155c and is not doped. The gate electrodes 155a, 155b, and 155c have protrusions, and the protrusions are electrically connected to the second semiconductors 132a, 132b, and 132c through the opening and the connecting members 176a, 176b, and 176c. In detail, the gate electrodes 155a, 155b, and 155c positioned on the second conductive layer are electrically connected to the connecting members 176a, 176b, and 176c positioned on the third conductive layer through the opening formed in the third insulating layer 160, and the connecting members 176a, 176b, and 176c are electrically connected to the second semiconductors 132a, 132b, and 132c through the openings formed in the second insulating layer 140 and the third insulating layer 160.

A structure of the three gate electrodes 155a, 155b, and 155c according to an embodiment described with reference to FIG. 10 will now be described in detail.

The gate electrode 155a of the driving transistor (T1) of the first pixel (PXa) includes a first portion overlapping the first semiconductor 131a and a second portion extending from the first portion, overlapping the lower storage electrode 125a and the upper storage electrode 175a, and configuring a second electrode of the storage capacitor (Cst). The gate electrode 155a of the driving transistor (T1) of the first pixel (PXa) further includes a protrusion protruding to be electrically connected to the connecting member 176a through the opening formed in the third insulating layer 160. The second region of the first semiconductor 131a may include a portion that is removed to be electrically connected to the upper storage electrode 175a through the openings formed in the second insulating layer 140 and the third insulating layer 160. The upper storage electrode 175a may include a portion that is removed to be electrically connected to the lower storage electrode 125a through the openings formed in the first insulating layer 120, the second insulating layer 140, and the third insulating layer 160.

Here, the border line of the gate electrode 155a of the driving transistor (T1) of the first pixel (PXa) may exclude a protrusion and an additional protrusion and may be positioned further inside the border line of the lower storage electrode 125a and/or the border line upper storage electrode 175a excluding the same in a plan view. The protrusion of the gate electrode 155a of the driving transistor (T1) is connected to the second semiconductor 132a through the connecting member 176a, and functions to control an overlapping area for forming the storage capacitor (Cst) to be constant when the additional protrusion of the gate electrode 155a of the driving transistor (T1) protrudes on the opposite side of the protrusion and the gate electrode 155a of the driving transistor (T1) is erroneously arranged.

According to an embodiment described with reference to FIG. 10, compared to the embodiment described with reference to FIG. 2, there is a portion in which the gate electrode 155a of the driving transistor (T1) is not covered by the lower storage electrode 125a and/or the upper storage electrode 175a, and when the interference rate expressed in Equation 1 is equal to or less than a predetermine numerical value (0.1%), the parasitic capacitance (Cp) among adjacent pixels may be ignored.

The gate electrode 155b of the driving transistor (T1) of the second pixel (PXb) may be symmetric with the gate electrode 155a of the driving transistor (T1) of the first pixel (PXa) with respect to an imaginary line extending in the x-axis direction. However, the gate electrode 155b of the driving transistor (T1) of the second pixel (PXb) has a dented structure corresponding to the additional protrusion of the gate electrode 155a of the driving transistor (T1) of the first pixel (PXa). An additional protrusion is formed on the gate electrode 155b of the driving transistor (T1) of the second pixel (PXb) corresponding to the portion in which the additional protrusion of the gate electrode 155a of the driving transistor (T1) of the first pixel (PXa) is not formed. Portions in which the gate electrode 155a of the driving transistor (T1) of the first pixel (PXa) faces the gate electrode 155b of the driving transistor (T1) of the 2 pixel (PXb) are formed at regular intervals. In this, the interval between the two gate electrodes 155a and 155b may be equal to or greater than 1 μm.

The gate electrode 155c of the driving transistor (T1) of the third pixel (PXc) may have the same structure as the gate electrode 155a of the driving transistor (T1) of the first pixel (PXa). As a result, the border line of the gate electrode 155c of the driving transistor (T1) of the third pixel (PXc) may be positioned further inside the border line of the lower storage electrode 125c and/or the border line of the upper storage electrode 175c except for the protrusion and the additional protrusion in a plan view.

Referring to FIG. 10, the border is positioned further outside the lower storage electrodes 125a, 125b, and 125c than the upper storage electrodes 175a, 175b, and 175c. The gap among the adjacent lower storage electrodes 125a, 125b, and 125c may be equal to or greater than 1 μm.

The input transistor (T2) has a channel, a first region, and a second region on the second semiconductors 132a, 132b, and 132c positioned on the first insulating layer 120, and the first region and the second region are doped and have a same or similar conductive characteristic. The first regions of the second semiconductors 132a, 132b, and 132c are electrically connected to the connecting members 177a, 177b, and 177c through the openings formed in the second insulating layer 140 and the third insulating layer 160, and the connecting members 177a, 177b, and 177c are electrically connected to the data lines 171a, 171b, and 171c through the openings formed in the first insulating layer 120, the second insulating layer 140, and the third insulating layer 160 to receive data voltages (DVa, DVb, and DVc). The second regions of the second semiconductors 132a, 132b, and 132c are electrically connected to the openings formed in the second insulating layer 140 and the third insulating layer 160 and the connecting members 176a, 176b, and 176c, and the connecting members 176a, 176b, and 176c are electrically connected to the gate electrodes 155a, 155b, and 155c through the opening formed in the third insulating layer 160. Depending on embodiments, the connecting members 176a, 176b, and 176c may extend toward the channels of the second semiconductors 132a, 132b, and 132c and may cover the channels of the second semiconductors 132a, 132b, and 132c.

The second semiconductors 132a, 132b, and 132c are covered by the second insulating layer 140, and a gate electrode 156 is positioned on the second insulating layer 140. In a plan view, channels are formed on the second semiconductors 132a, 132b, and 132c overlapping the gate electrode 156, and the channels are covered by the gate electrode 156 and are not doped. The gate electrode 156 extends to pass through the opening formed in the third insulating layer 160 and is electrically connected to the first scan signal line 151 positioned on the third conductive layer.

The initialization transistor (T3) has a channel, a first region, and a second region on the third semiconductors 133a, 133b, and 133c positioned on the first insulating layer 120, and the first region and the second region are doped and have a same or similar conductive characteristic as/to a conductor. The first regions of the third semiconductors 133a, 133b, and 133c are electrically connected to the upper storage electrodes 175a, 175b, and 175c positioned on the third conductive layer through the opening formed in the second insulating layer 140 and the third insulating layer 160. The upper storage electrodes 175a, 175b, and 175c are electrically connected to the lower storage electrodes 125a, 125b, and 125c through the openings formed in the first insulating layer 120, the second insulating layer 140, and the third insulating layer 160, and are electrically connected to the first semiconductors 131a, 131b, and 131c through the openings formed in the second insulating layer 140 and the third insulating layer 160. The second regions of the third semiconductors 133a, 133b, and 133c are electrically connected to the initialization voltage connector 173-3 through the openings formed in the second insulating layer 140 and the third insulating layer 160 to receive the initialization voltage (VINT). The third semiconductors 133a, 133b, and 133c are covered by the second insulating layer 140, and a gate electrode 157 is positioned on the second insulating layer 140. In a plan view, channels are formed on the third semiconductors 133a, 133b, and 133c overlapping the gate electrode 157, and the channels are covered by the gate electrode 157 and are not doped. The gate electrode 157 extends to pass through the opening formed in the third insulating layer 160 and is electrically connected to the second scan signal line 151-1 positioned on the third conductive layer.

The storage capacitor (Cst) includes a storage capacitor 1 (Cst1) and a storage capacitor 2 (Cst2).

The storage capacitor 1 (Cst1) includes gate electrodes 155a, 155b, and 155c positioned on the second conductive layer, a third insulating layer 160 positioned thereon, and upper storage electrodes 175a, 175b, and 175c positioned thereon. The storage capacitor 2 (Cst2) includes lower storage electrodes 125a, 125b, and 125c positioned on the first conductive layer, a first insulating layer 120 and a second insulating layer 140 positioned thereon, and gate electrodes 155a, 155b, and 155c positioned thereon. As a result, it has a triple-layer structure including gate electrodes 155a, 155b, and 155c in common, and two storage electrodes (upper storage electrodes 175a, 175b, and 175c and lower storage electrodes 125a, 125b, and 125c overlapping top to bottom in a plan view.

The lower storage electrodes 125a, 125b, and 125c are electrically connected to the upper storage electrodes 175a, 175b, and 175c through the openings formed in the first insulating layer 120, the second insulating layer 140, and the third insulating layer 160, and the gate electrodes 155a, 155b, and 155c are included in common by the storage capacitor 1 (Cst1) and the storage capacitor 2 (Cst2), so the storage capacitor 1 (Cst1) and the storage capacitor 2 (Cst2) are coupled in parallel to each other according to a circuit structure. They have a structure coupled in parallel according to the circuit structure, so the entire capacitance of the storage capacitor (Cst) has a sum of values of the capacitance of the storage capacitor 1 (Cst1) and the capacitance of the storage capacitor 2 (Cst2).

The upper storage electrodes 175a, 175b, and 175c are integrally formed, and are electrically connected to anodes (not shown) of the light emitting diodes (EDa, EDb, and EDc) through the openings 185a, 185b, and 185c formed in the fourth insulating layer 180. Depending on embodiments, an additional member (i.e., an anode connecting member) for connecting the upper storage electrodes 175a, 175b, and 175c and the anodes 191a, 191b, and 191c may be further included.

A partition wall (refer to 350 of FIG. 21), an emission layer (refer to 370 of FIG. 21), and a cathode (refer to 270 of FIG. 21) may be further formed on the anodes 191a, 191b, and 191c of the light emitting diodes (EDa, EDb, and EDc), and an encapsulation layer, a color conversion layer, or a color filter may be included thereon, which will be described with reference to FIG. 21.

According to an embodiment described with reference to FIG. 10, the interference among the adjacent pixels may be reduced by setting the value of the interference rate among the adjacent pixels on the adjacent pixels to be equal to or less than 0.1%. The interference rate in this case is given in Equation 1, and Equation 1 will be referred to as an interference rate in the present specification.

$$\text{Interference Rate} = (C1 + C2)/C3, \quad \text{[Equation 1]}$$

where C1 is a capacitance of the first capacitor, the first capacitor is an interference capacitor between the gate node and the anode node among the adjacent pixels, C2 is a capacitance of the second capacitor, the second capacitor is an interference capacitor between the gate nodes of the two adjacent pixels, C3 is a capacitance of the third capacitor, and the third capacitor is a storage capacitor (Cst) of the present pixel.

In detail, C1 may be a capacitance between the anode of the adjacent pixel and the gate electrode of the driving transistor of the present pixel, C2 may be a capacitance between the gate electrode of the driving transistor of the adjacent pixel and the gate electrode of the driving transistor of the present pixel, and C3 may be a capacitance of the storage capacitor of the pixel. Further, C1 may be a capacitance between the upper storage electrode electrically connected to the anode of the adjacent pixel and the connecting members 176a, 176b, and 176c connected to the gate electrode of the driving transistor of the present pixel and connecting to the input transistor. Further, C2 may be a capacitance among the connecting members 176a, 176b, and 175c.

The interference rate among the adjacent pixels according to Equation 1 has no units, and it indicates a degree by which there is no need to consider mutual interference between two pixels that have a value that is equal to or less than 0.1%, that is, equal to or less than 1/1000. A reference to 0.1% may be a value calculated by discarding or rounding off the numerical value of three or more places of decimals in the value of the percentage (%). A reason of discarding or rounding off is that the corresponding value is already less than 1/100,000, which gives substantially no influence on the actual interference rate.

A first capacitor, a second capacitor, and a third capacitor will now be accurately described with reference to FIG. 11 to FIG. 18 before the interference rate according to Equation 1 is described in detail.

The first capacitor used when the interference rate between adjacent pixels is calculated will now be described with reference to FIG. 11 to FIG. 13.

Figure 11:
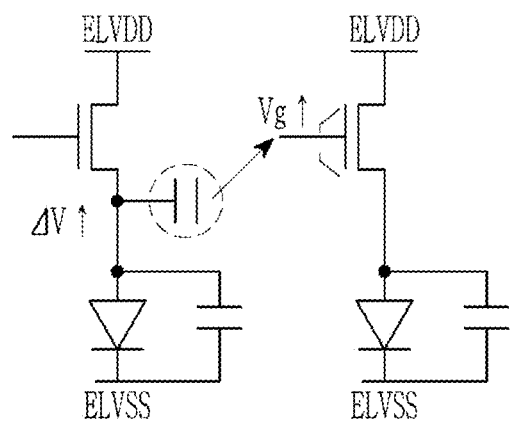
FIG. 11 illustrates a circuit diagram of a first capacitor between adjacent pixels according to an embodiment.
Figure 12:
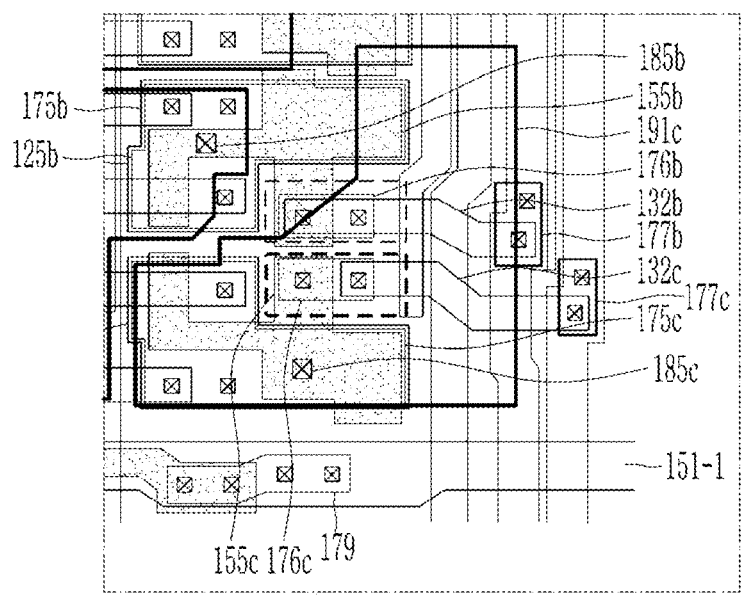
FIG. 12 illustrates an enlarged top plan view of a first capacitor between adjacent pixels according to an embodiment.

FIG. 11 shows a circuit diagram of a first capacitor between adjacent pixels according to an embodiment, FIG. 12 shows an enlarged top plan view of a first capacitor between adjacent pixels according to an embodiment, and FIG. 13 shows a cross-sectional view of a first capacitor between adjacent pixels according to an embodiment.

As shown in FIG. 11, the first capacitor between adjacent pixels is the interference capacitor between the gate node and the anode node of the two adjacent pixels, and it may signify a capacitor of the gate node of the present pixel for the anode node of the adjacent pixel. That is, C1 may signify a degree of influence provided by a change of voltage at an anode node of a pixel adjacent to the gate node of the present pixel. When the value of C1 is large, it means that the change of voltage at an anode node of an adjacent pixel provides a large influence to the gate node of the present pixel.

Capacitance of the first capacitor between the adjacent pixels may be found by using the actual pixel structure, and it may be used as the value of C1. The value of C1 may be indirectly calculated based on the pixel structure and may then be used, and in this instance, the first capacitor that is the main one from among the first capacitors between the adjacent pixels may be considered, it may be calculated, and it may be applied to Equation 1.

A method for finding capacitance C1 of the first capacitor in a detailed structure will now be described with reference to FIGS. 12 and 13.

FIG. 12 and FIG. 13 show an enlarged portion in the structure of FIG. 10, and the adjacent pixel will be referred to as a third pixel (PXc), and the present pixel will be set as a second pixel (PXb).

Referring to FIG. 12, the anode 191c of the third pixel (PXc) overlaps part of the second pixel (PXb), and particularly overlaps at least part of the connecting member 176b, part of the gate electrode 155b, part of the second semiconductor 132b, part of the upper storage electrode 175b, and part of the lower storage electrode 125b. The connecting member 176b and the gate electrode 155b correspond to the gate node from among them, the connecting member 176b is positioned on the third conductive layer from among them, and the gate electrode 155b is positioned on the second conductive layer, so a big interference capacitor (or a parasitic capacitor) between the connecting member 176b positioned on the top and the anode 191c of the third pixel (PXc) is formed. Therefore, the first capacitor is set by the capacitor between the connecting member connected to the gate electrode of the driving transistor (T1) of the present pixel and the anode of the adjacent pixel. Capacitance of the first capacitor may be calculated based on the overlapping area of the connecting member connected to the gate electrode of the driving transistor (T1) of the present pixel and the anode of the adjacent pixel in a plan view. The capacitance of the first capacitor calculated according to the above description may be substituted as C1 into Equation 1, and may then be calculated.

For a clearer calculation, permittivity of the fourth insulating layer 180 may be considered, and capacitance between the anode of the adjacent pixel and the gate electrode of the driving transistor (T1) of the present pixel may be additionally considered.

A second capacitor used when an interference rate between adjacent pixels is calculated will now be described with reference to FIG. 14 and FIG. 15.

Figure 14:
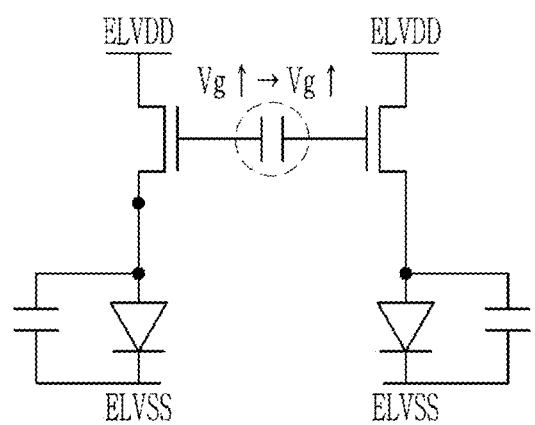
FIG. 14 illustrates a circuit diagram of a second capacitor between adjacent pixels according to an embodiment.
Figure 15:
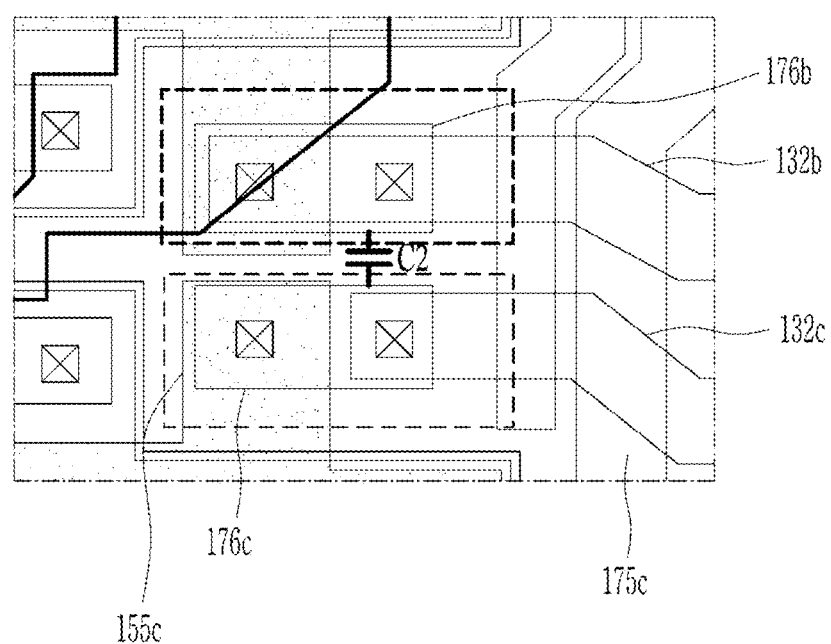
FIG. 15 illustrates an enlarged top plan view of a second capacitor between adjacent pixels according to an embodiment.

FIG. 14 shows a circuit diagram of a second capacitor between adjacent pixels according to an embodiment, and FIG. 15 shows an enlarged top plan view of a second capacitor between adjacent pixels according to an embodiment.

The second capacitor between adjacent pixels is an interference capacitor between gate nodes of two adjacent pixels as shown in FIG. 14. That is, capacitance C2 of the second capacitor may signify the degree of influence of the change of the voltage at the gate node of the adjacent pixel given to the gate node of the present pixel. When the value of C2 is large, it means that the change of the voltage at the gate node of the adjacent pixel substantially influences the gate node of the present pixel.

Capacitance C2 of the second capacitor between the adjacent pixels may be found by using the actual pixel structure, and it may be used as the value of C2. The value of C2 may be indirectly calculated based on the pixel structure and may then be used, and in this instance, the second capacitor that is the main one from among the second capacitors between the adjacent pixels may be considered, it may be calculated, and it may be applied to Equation 1.

A method for finding capacitance C2 of the second capacitor in a detailed structure will now be described with reference to FIG. 15.

FIG. 15 show an enlarged portion in the structure of FIG. 10, and the adjacent pixel will be referred to as a third pixel (PXc), and the present pixel will be set as a second pixel (PXb).

Referring to FIG. 15, the gate node of the third pixel (PXc) is positioned on the connecting member 176c and the gate electrode 155c, and the gate node of the second pixel (PXb) is positioned on the connecting member 176b and the gate electrode 155b. The greatest influence is generated by the portions positioned the nearest from among the two gate nodes, so the second capacitor may signify the capacitor between the most adjacent portions. Referring to FIG. 15, the value of C2 may be set by the capacitance between the two connecting members 176b and 176c and the capacitance between the protrusions of the two gate electrodes 155b and 155c. The second capacitor is, different from the first capacitor, a capacitor between sides that are horizontally adjacent to each other on a same plane, so an area and a gap of sides facing each other may be important factors. Therefore, the value of C2 may be set by a summation of a first value in which facing sides between two connecting members 176b and 176c are defined by an area and a distance therebetween and a second value in which facing sides between the two connecting members 176b and 176c are defined by the area and the distance therebetween. In another way, when thicknesses of conductive layers are substantially similar to each other from among the areas of the facing sides, the capacitance may be calculated by using a length in a plan view instead of the area. Depending on embodiments, the value that is further influential between the first value and the second value may be used to set the same as the value of C2.

For a clearer calculation, permittivity of the insulating layer positioned between electrodes of a capacitor may be considered, and capacitance generated through a predetermined portion other than the protrusions of the two gate electrodes 155b and 155c.

A third capacitor used when an interference rate between adjacent pixels will now be described with reference to FIG. 16 to FIG. 18.

Figure 16:
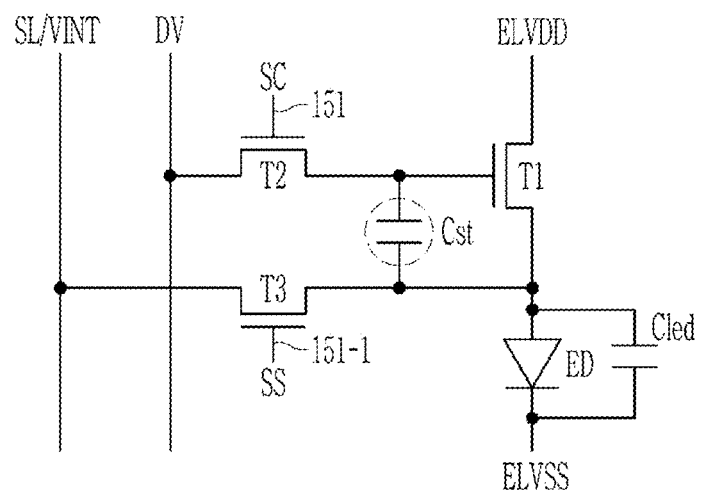
FIG. 16 illustrates a circuit diagram of a storage capacitor of one pixel according to an embodiment.
Figure 17:
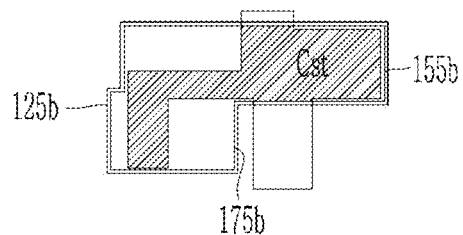
FIG. 17 illustrates an enlarged top plan view of a storage capacitor of one pixel according to an embodiment.

FIG. 16 shows a circuit diagram of a storage capacitor of one pixel according to an embodiment, FIG. 17 shows an enlarged top plan view of a storage capacitor of one pixel according to an embodiment, and FIG. 18 shows a cross-sectional view of a storage capacitor of one pixel according to an embodiment.

As shown in FIG. 16, the third capacitor is a storage capacitor (Cst) of the present pixel. Regarding capacitance of the storage capacitor (Cst) of each pixel, there is capacitance of the storage capacitor (Cst) that is set as a target when the actual pixel is designed, and the corresponding capacitance may be used as C3 and may be used in Equation 1 when the targeted value is known.

When the targeted value is not known, the capacitance of the storage capacitor (Cst) may be calculated by use of the actual pixel structure, and may be applied to Equation 1.

A method for finding capacitance C3 of the third capacitor will now be described with reference to FIG. 17 and FIG. 18.

FIG. 17 shows an enlarged portion of the structure described with reference to FIG. 10, illustrating the gate electrode 155b of the driving transistor (T1) of the second pixel (PXb), the lower storage electrode 125b, and the upper storage electrode 175b.

FIG. 17 shows that a portion marked with slashes represents a portion on which the storage capacitor (Cst) is formed, and as shown in FIG. 18, the sum of the storage capacitor (Cst1) and the storage capacitor2 (Cst2) may be used as the value of C3.

Here, the storage capacitor1 (Cst1) includes: gate electrodes 155a, 155b, and 155c positioned on the second conductive layer, a third insulating layer 160 positioned thereon, upper storage electrodes 175a, 175b, and 175c positioned thereon. The storage capacitor2 (Cst2) includes lower storage electrodes 125a, 125b, and 125c positioned on the first conductive layer, a first insulating layer 120 and a second insulating layer 140 positioned thereon, and gate electrodes 155a, 155b, and 155c positioned thereon.

The lower storage electrodes 125a, 125b, and 125c and the upper storage electrodes 175a, 175b, and 175c are electrically connected to each other through the openings formed in the first insulating layer 120, the second insulating layer 140, and the third insulating layer 160, and the gate electrodes 155a, 155b, and 155c are included by the storage capacitor1 (Cst1) and the storage capacitor2 (Cst2), so the storage capacitor) (Cst1) and the storage capacitor2 (Cst2) are coupled in parallel to each other according to a circuit configuration. They have a structure coupled in parallel according to the circuit structure, so entire capacitance of the storage capacitor (Cst) has a sum of values of capacitance of the storage capacitor 1 (Cst1) and capacitance of the storage capacitor 2 (Cst2).

Capacitance of the storage capacitor1 (Cst1) and the storage capacitor2 (Cst2) are mainly influenced by the overlapping area (refer to the slashes of FIG. 17), so the value calculated with respect to the overlapping area in a plan view may be used. In this instance, the thickness and dielectricity of the insulating layer positioned therebetween may be considered.

A concept of the interference rate expressed in Equation 1 will now be described based on the first capacitor, the second capacitor, and the third capacitor.

A voltage changing degree (corresponding to the value of C1) at the gate node of the present pixel according to the voltage change at the anode node of the adjacent pixel and a voltage changing degree (corresponding to the value of C2) at the gate node of the present pixel according to the voltage change at the gate node of the adjacent pixel are summed. The summed values are divided by a degree (corresponding to capacitance of the storage capacitor (Cst), that is, C3) for maintaining the voltage at the gate node of the present pixel to thus determine the degree of changing the gate node of the present pixel as a ratio according to the voltage change of the anode node and the gate node of the adjacent pixel.

When the concept of the interference rate of Equation 1 is calculated with various display panels based on the first capacitor, the second capacitor, and the third capacitor, the results of Table 1 are obtained.

lumped into one color and are displayed. That is, the interference rate among adjacent pixels is high from among various colors, and the corresponding colors are not displayed, which is one of display quality deteriorating factors. This will now be described with reference to FIG. 19.

Figure 19:
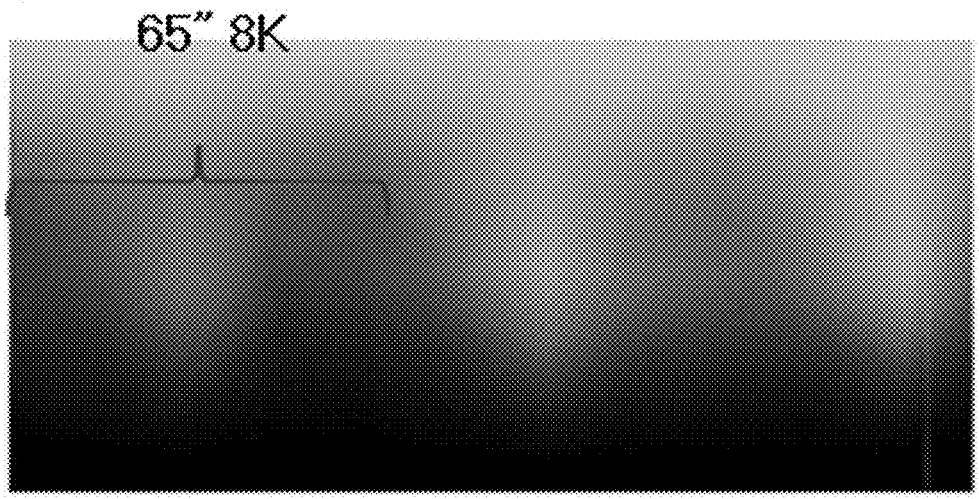
FIG. 19 is an example in which an error of color expression is generated according to a test result of Table 1.
Figure 19:
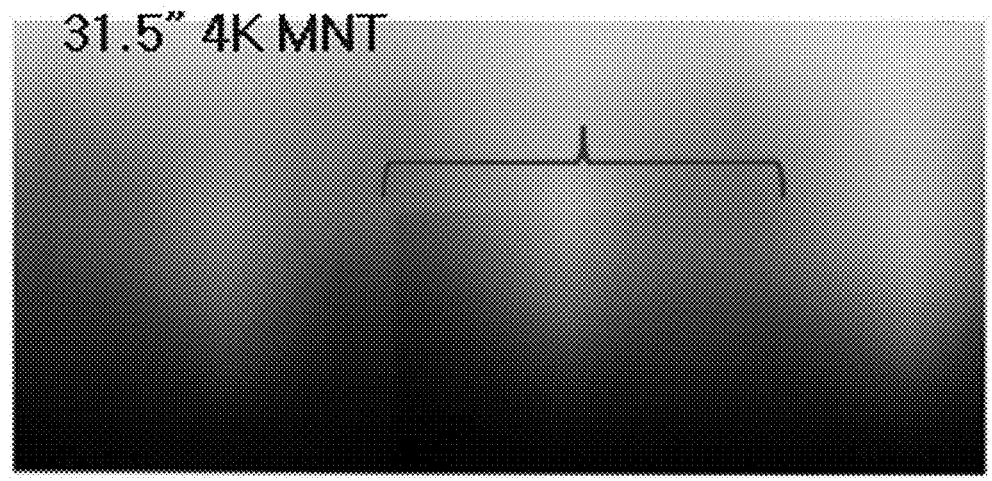

FIG. 19 shows an example in which an error of color expression is generated according to a test result of Table 1.

Referring to Table 1, tests are performed using three panels, wherein the first column uses a TV panel (65" 4K) for displaying 65" 4K resolution, the second column uses a TV panel (65" 8K) for displaying 65" 8K resolution, and the third column uses a monitor panel (31.5" 4K) for displaying 31.5" 4K resolution.

According to Table 1, it is found that the first TV panel (65" 4K) has no problem in color expression, but it is found that the second TV panel (65" 8K) and the third monitor panel (31.5" 4K) fail to display the accurate colors at predetermined positions as shown in (A) and (B) of FIG. 19.

Referring to Table 1, it is found that the first TV panel (65" 4K) having no trouble has the interference rate between adjacent pixels that is equal to or less than 0.10%, and the other panels have the interference rate of up to 1.8% or 2.1%. It is found that the panel with a high interference rate generates a color expression problem, and there is no problem with interference rate of up to 0.10%.

Therefore, it is desirable to reduce the interference between adjacent pixels and prevent generation of errors of color expression by designing the interference rate between adjacent pixels to be equal to or less than 0.10%.

An embodiment including a circuit shown in FIG. 1 has been described. Regarding the embodiment described with reference to FIG. 1, the gate electrode of the initialization transistor (T3) receives a scan signal that is different from that received by the gate electrode of the input transistor (T2).

However, depending on embodiments, the gate electrode of the initialization transistor (T3) may receive the same same scan signal (i.e., the first scan signal (SC)) as the gate electrode of the input transistor (T2).

Such a modified embodiment will now be described with reference to FIG. 20.

Figure 20:
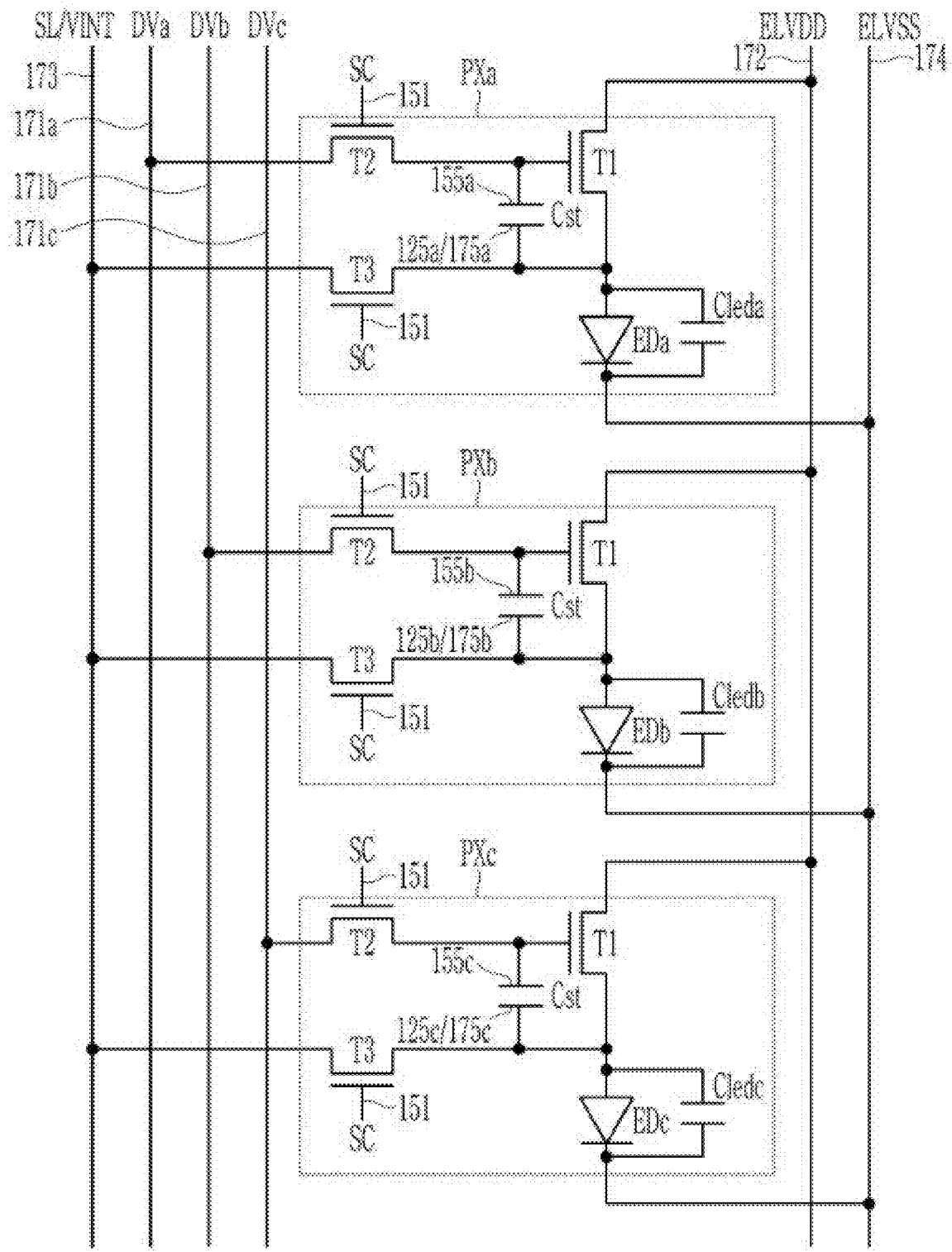
FIG. 20 illustrates a circuit diagram of a pixel of a light emitting display device according to another embodiment.

FIG. 20 shows a circuit diagram of a pixel of a light emitting display device according to another embodiment.

TABLE 1

| Experimental Example Value of C3 (Cst) | | 65" 4K 1.22E−12 | | 65" 8K 1.49E−13 | | 31.5" 4K 1.52E−13 | |
| --- | --- | --- | --- | --- | --- | --- | --- |
| C1: anode-gate C2: gate-gate | | C1 + C2 | C1 + C2/C3 (Interference rate) | C1 + C2 | C1 + C2/C3 (Interference rate) | C1 + C2 | C1 + C2/C3 (Interference rate) |
| Red | Green | 9.35E−16 | 0.10% | 1.35E−17 | 0.00% | 3.23E−15 | 2.10% |
| Red | Blue | 1.06E−17 | 0.00% | 2.64E−15 | 1.80% | 2.41E−16 | 0.20% |
| Green | Red | 9.46E−16 | 0.10% | 1.31E−17 | 0.00% | 6.24E−16 | 0.40% |
| Green | Blue | 6.91E−16 | 0.10% | 2.82E−17 | 0.00% | 4.89E−16 | 0.30% |
| Blue | Red | 1.51E−17 | 0.00% | 9.51E−16 | 0.60% | 2.98E−17 | 0.00% |
| Blue | Green | 4.04E−16 | 0.00% | 9.10E−16 | 0.60% | 5.64E−16 | 0.40% |
| Color expression errors | | Not generated | | Generated | | Generated | |

Here, units of respective capacitance are omitted, E-12 represents $10^{-12}$, E-13 represents $10^{-13}$, E-16 represents $10^{-16}$, and E-17 represents $10^{-17}$.

The color expression errors in Table 1 represent the case in which, when various colors are expressed, the colors belonging to a specific range are not distinguished but are Referring to FIG. 20, differing from FIG. 1, the gate electrode of the initialization transistor (T3) is connected to the first scan signal line 151 for transmitting the first scan signal (SC).

According to the above-described embodiment, a programming operation for inputting a data voltage as the input transistor (T2) is turned on, an initialization operation for changing the voltage at the anodes of the light emitting diodes (EDa, EDb, and EDc) into an initialization voltage (VINT) as the initialization transistor (T3) is turned on, and/or a sensing operation for sensing a voltage at the anodes of the light emitting diodes (EDa, EDb, and EDc) are performed within the same section. In this instance, the sensing operation may be performed in advance of the initialization operation.

Since the display panel displays high resolution, a space for forming the pixel circuit unit on the panel becomes insufficient. However, according to FIG. 20, one wire may be reduced compared to the embodiment described with reference to FIG. 1, and the space for forming a pixel circuit unit may be acquired on the panel as a merit.

Regarding the light emitting display device, a light emitting diode (LED) including an anode, an emission layer, and a cathode may be on the fourth insulating layer, and an encapsulation layer, a color conversion layer, or a color filter may be additionally positioned on the light emitting diode (LED). A detailed cross-sectional configuration of an entire light emitting display device will now be described with reference to FIG. 21.

Figure 21:
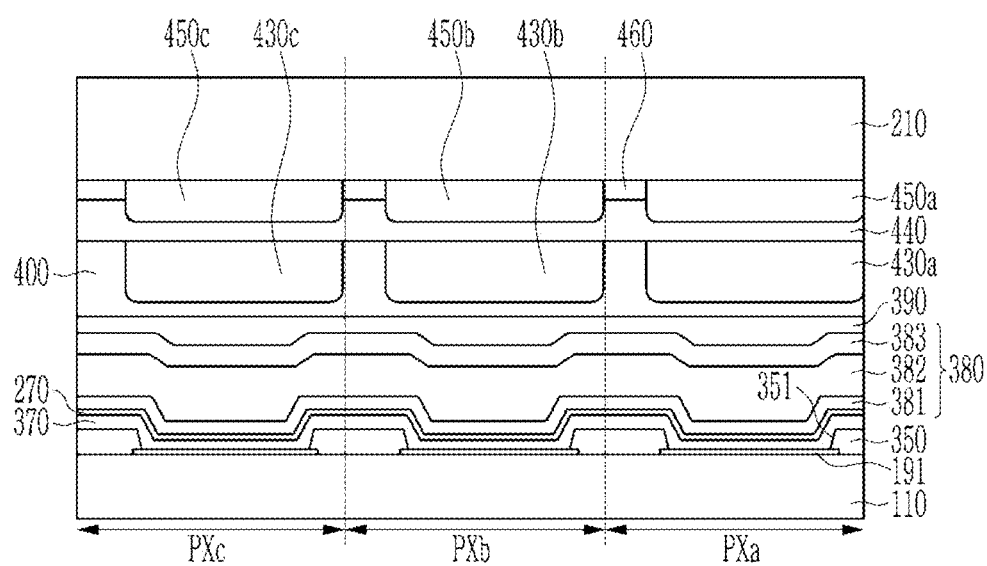
FIG. 21 illustrates a cross-sectional view of a light emitting display device according to an embodiment.

FIG. 21 shows a cross-sectional view of a light emitting display device according to an embodiment.

FIG. 21 has omitted the pixel circuit unit from the configuration of the light emitting display device according to an embodiment, and illustrates anodes 191 configuring the light emitting diodes (EDa, EDb, and EDc).

As shown in FIG. 21, anodes 191 are on the substrate 110 for the respective pixels (PXa, PXb, and PXc). The configuration of the pixel circuit unit such as a plurality of transistors and insulating layers positioned between the substrate 110 and the anode 191 is omitted, and for example, they may be disposed as shown in FIG. 2 to FIG. 4.

A partition wall 350 is on the anode 191, and includes an opening 351 exposing part of the anode 191.

An emission layer 370 may be on the anode 191 and the partition wall 350, and the emission layer 370 is positioned in the entire region according to the present embodiment. In this instance, the emission layer 370 may emit first color light that may be blue light. Depending on embodiments, the emission layer 370 may be separately formed with respect to the opening 351 of the respective pixels, and in this instance, the emission layers of the respective pixels may emit light of different colors. A cathode 270 may be on the entire emission layer 370.

An encapsulation layer 380 including a plurality of insulating layers 381, 382, and 383 may be on the cathode 270. The insulating layer 381 and the insulating layer 383 may include inorganic insulating materials, and an insulating layer 382 between the insulating layer 381 and the insulating layer 383 may include an organic insulating material.

A filling layer 390 including a filler may be on the encapsulation layer 380. A capping layer 400 including an insulating material, and a plurality of color conversion layers 430a and 430b and a transmission layer 430c may be on the filling layer 390.

The transmission layer 430c may transmit incident light. That is, the transmission layer 430c may transmit first color light that may be blue light. The transmission layer 430c may include a polymer material for transmitting the first color light. A region in which the transmission layer 430c is positioned may correspond to a light emitting region for emitting blue light, and the transmission layer 430c may not include a semiconductor nanocrystal and may transmit the incident first color light.

The color conversion layers 430a and 430b may include different types of semiconductor nanocrystal. For example, the first color light input to the color conversion layer 430a may be converted into second color light and may then be discharged by the semiconductor nanocrystal included by the color conversion layer 430b. The first color light input to the color conversion layer 430b may be converted into third color light and may then be discharged by the semiconductor nanocrystal included by the color conversion layer 430b.

The semiconductor nanocrystal may include at least one of a fluorescent substance for converting the incident first color light into second color light or third color light and a quantum dot material.

A core of the quantum dot may be selected from among a group II-VI compound, a group III-V compound, a group IV-VI compound, a group IV element, a group IV compound, and a combination thereof.

The group II-VI compound may be selected from among a binary compound selected from among CdSe, CdTe, ZnS, ZnSe, ZnTe, ZnO, HgS, HgSe, HgTe, MgSe, MgS, and a mixture thereof; a tertiary compound selected from among AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from among HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from among a binary compound selected from among GaN, GaP, GaAs, GaSb, AlN, AlP, AlAs, AlSb, InN, InP, InAs, InSb, and a mixture thereof; a tertiary compound selected from among GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from among GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from among a binary compound selected from among SnS, SnSe, SnTe, PbS, PbSe, PbTe, and a mixture thereof; a tertiary compound selected from among SnSeS, SnSeTe, SnSTe, PbSeS, PbSeTe, PbSTe, SnPbS, SnPbSe, SnPbTe, and a mixture thereof; and a quaternary compound selected from among SnPbSSe, SnPbSeTe, SnPbSTe, and a mixture thereof. The group IV element may be selected from among Si, Ge, and a mixture thereof. The group IV compound may be a binary compound selected from among SiC, SiGe, and a mixture thereof.

In this instance, the binary compound, the tertiary compound, or the quaternary compound may exist in the particles with uniform concentration, or may exist in the same particles with a concentration distribution partially divided into some states. Further, the color conversion media layer may have a core/shell structure where one quantum dot surrounds another quantum dot. An interface between the core and the shell may have a concentration gradient such that a concentration of an element existing in the shell is gradually reduced nearing the center thereof.

In some embodiments, the quantum dot may have a core-shell structure including a core including the above-described nanocrystal and a shell surrounding the core. The shell of the quantum dot may function as a protective layer for maintaining the semiconductor characteristic by preventing chemical denaturation of the core and/or a charging layer for providing an electrophoretic characteristic to the quantum dot. The shell may be a single layer or a multiplayer. An interface between the core and the shell may have a concentration gradient such that a concentration of an element existing in the shell is gradually reduced nearing the center thereof. Examples of the shell of the quantum dot include a metallic or non-metallic oxide, a semiconductor compound, or a combination thereof.

For example, the metallic or non-metallic oxide may exemplify binary compounds such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, or tertiary compounds such as $MgAl_2O_4$, $CoFe_2O_4$, $NiFe_2O_4$, or $CoMn_2O_4$, and the present invention is not limited thereto.

The semiconductor compound may exemplify CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, and the present invention is not limited thereto.

The quantum dot may have a full width at half maximum (FWHM) of a light-emitting wavelength spectrum that is less than about 45 nm, preferably less than about 40 nm, or further preferably less than about 30 nm, and it may improve color purity or color reproducibility within this range. Further, light emitted through the quantum dot is output in all directions, thereby improving a light viewing angle.

According to another embodiment, the emission layer 370 may include a quantum dot and not a plurality of color conversion layers 430a and 430b and a transmission layer 430c.

The substrates 110 and 210 may be made of the same material. The encapsulation layer 380 may be formed on the substrate 110, and the color filters 450a, 450b, and 450c, the light blocking member 460, the insulating layer 440, the color conversion layers 430a and 430b, the transmission layer 430c, and the capping layer 400 may be formed on the substrate 210. The substrate structures at the upper side and the lower side may be attached by using a filling layer 390. In this instance, the substrate structures at the upper side and the lower side may be attached by further including a sealant inside or outside the filling layer 390.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 10: light emitting display device | 110, 210: substrate |
| PXa, PXb, PXc: pixel | T1: driving transistor |
| T2: input transistor | T3: initialization transistor |
| Cst, Cst1, Cst2: storage capacitor | Cp: parasitic capacitance |
| EDa, EDb, EDc: light emitting diode | Cleda, Cledb, Cledc: emitter capacitor |
| 151, 151-1: scan signal line | 171: data line |
| 172: driving voltage line | 173: initialization voltage line |
| 174: driving low voltage line | 155, 156, 157: gate electrode |
| 125: lower storage electrode | 175: upper storage electrode |
| 191: anode | 131, 132, 133: semiconductor |
| 120, 140, 160, 180: insulating layer | 126b, 176, 177, 178, 179: connecting member |
| 185, 186, 351: opening | 194: cathode connector |
| 270: cathode | 350: partition wall |
| 370: emission layer | 380: encapsulation layer |
| 381, 382, 383, 440: insulating layer | 390: filling layer |
| 400: capping layer | 430a, 430b: color conversion layer |
| 430c: transmission layer 450: color filter | |
| 460: light blocking member | |

Further, the form of the quantum dot is one generally used in the art and is not particularly limited, but more specifically, it may be formed to be spherical, pyramidal, multi-armed, or cubic nanoparticles, nanotubes, nanowires, nanofibers, and nanoplate-shaped particles.

The quantum dot may control the output color of light according to the size of particles, and hence, the quantum dot may have various light-emitting colors such as blue, red, and green.

An insulating layer 440 may be on a plurality of color conversion layers 430a, and 430b and a transmission layer 430c, and a plurality of color filters 450a, 450b, and 450c and a light blocking member 460 may be thereon.

The color filter 450a may express second color light, the color filter 450b may express third color light, and the color filter 450c may express first color light.

The light blocking member 460 may be among the neighboring color filters 450a, 450b, and 450c.

A substrate 210 may be on a plurality of color filters 450a, 450b, and 450c and a light blocking member 460. That is, a plurality of color conversion layers 430a, and 430b and a plurality of color filters 450a, 450b, and 450c may be between the substrate 110 and the substrate 210.

What is claimed is:

1. A light emitting display device comprising:
    a first pixel including a first lower storage electrode, a first gate electrode of a first driving transistor, and a first upper storage electrode; and
    a second pixel provided near the first pixel, and including a second lower storage electrode, a second gate electrode of a second driving transistor, and a second upper storage electrode,
    wherein:
    in a plan view, the first gate electrode and the second gate electrode have first sides facing each other;
    the first side of the first gate electrode is positioned inside a border of the first lower storage electrode in a plan view; and
    the first side of the second gate electrode is positioned inside a border of the second lower storage electrode or the second upper storage electrode in a plan view.

2. A light emitting display device comprising:
    a first pixel including a first lower storage electrode, a first gate electrode of a first driving transistor, and a first upper storage electrode; and a second pixel provided near the first pixel, and including
a second lower storage electrode, a second gate electrode of a second driving transistor, and a second upper storage electrode,
wherein:
in a plan view, the first gate electrode and the second gate electrode have first sides facing each other;
the first side of the first gate electrode is positioned inside a border of the first lower storage electrode and the first upper storage electrode in a plan view; and
the first side of the second gate electrode is positioned inside a border of the second lower storage electrode and the second upper storage electrode in a plan view.

3. The light emitting display device of claim 2, wherein:
the first lower storage electrode, the first gate electrode, and the first upper storage electrode sequentially overlap each other to form a first storage capacitor, and
the second lower storage electrode, the second gate electrode, and the second upper storage electrode sequentially overlap each other to form a second storage capacitor.

4. The light emitting display device of claim 3, wherein:
a first insulating layer and a second insulating layer are sequentially positioned on the first lower storage electrode and the second lower storage electrode,
the first gate electrode and the second gate electrode are positioned on the second insulating layer,
a third insulating layer is positioned on the first gate electrode and the second gate electrode, and
the first upper storage electrode and the second upper storage electrode are positioned on the third insulating layer.

5. A light emitting display device comprising:
a first pixel including a first lower storage electrode, a first gate electrode of a first driving transistor, and a first upper storage electrode; and
a second pixel provided near the first pixel, and including a second lower storage electrode, a second gate electrode of a second driving transistor, and a second upper storage electrode,
wherein:
in a plan view, the first gate electrode and the second gate electrode have first sides facing each other;
the first side of the first gate electrode is positioned inside a border of the first lower storage electrode or the first upper storage electrode in a plan view;
the first side of the second gate electrode is positioned inside a border of the second lower storage electrode or the second upper storage electrode in a plan view;
one side of the first lower storage electrode corresponding to the first side of the first gate electrode is positioned further outside one side of the first upper storage electrode corresponding to the first side of the first gate electrode in a plan view; and
one side of the second lower storage electrode corresponding to the first side of the second gate electrode is positioned further outside one side of the second upper storage electrode corresponding to the first side of the second gate electrode in a plan view.

6. The light emitting display device of claim 5, wherein a gap between the one side of the first lower storage electrode corresponding to the first side of the first gate electrode and the one side of the second lower storage electrode corresponding to the first side of the second gate electrode is equal to or greater than 1 μm.

7. A light emitting display device comprising:
a first pixel including a first lower storage electrode, a first gate electrode of a first driving transistor, and a first upper storage electrode; and
a second pixel provided near the first pixel, and including a second lower storage electrode, a second gate electrode of a second driving transistor, and a second upper storage electrode,
wherein:
in a plan view, the first gate electrode and the second gate electrode have first sides facing each other;
the first side of the first gate electrode is positioned inside a border of the first lower storage electrode or the first upper storage electrode in a plan view;
the first side of the second gate electrode is positioned inside a border of the second lower storage electrode or the second upper storage electrode in a plan view;
the first pixel further includes a first input transistor for receiving a data voltage from a first data line;
the second pixel further includes a second input transistor for receiving a data voltage from a second data line;
the first gate electrode includes a first protrusion connected to the first input transistor; and
the second gate electrode includes a second protrusion connected to the second input transistor.

8. The light emitting display device of claim 7, wherein:
the first protrusion is positioned outside a border of the first lower storage electrode and the first upper storage electrode in a plan view; and
the second protrusion is positioned outside a border of the second lower storage electrode and the second upper storage electrode in a plan view.

9. The light emitting display device of claim 7, wherein:
the first protrusion overlaps the first lower storage electrode and is positioned outside a border of the first upper storage electrode in a plan view; and
the second protrusion is positioned outside a border of the second lower storage electrode and the second upper storage electrode in a plan view.

10. The light emitting display device of claim 7, wherein:
the first protrusion overlaps the first upper storage electrode and is positioned outside a border of the first lower storage electrode in a plan view; and
the second protrusion is positioned outside a border of the second lower storage electrode and the second upper storage electrode in a plan view.

11. The light emitting display device of claim 10, wherein:
the first pixel further includes a first connecting member for connecting the first protrusion and the first input transistor; and
the first connecting member is positioned on a same layer with a same material as the first lower storage electrode.

12. The light emitting display device of claim 7, wherein:
the first pixel further includes a first connecting member for connecting the first protrusion and the first input transistor,
the second pixel further includes a second connecting member for connecting the second protrusion and the second input transistor, and
the first connecting member and the second connecting member are positioned on a same layer with a same material as the first upper storage electrode and the second upper storage electrode.

13. A light emitting display device comprising:
a first pixel including a first lower storage electrode, a first gate electrode of a first driving transistor, and a first upper storage electrode; and
a second pixel provided near the first pixel, and including a second lower storage electrode, a second gate electrode of a second driving transistor, and a second upper storage electrode,
wherein:
in a plan view, the first gate electrode and the second gate electrode have first sides facing each other;
the first side of the first gate electrode is positioned inside a border of the first lower storage electrode or the first upper storage electrode in a plan view;
the first side of the second gate electrode is positioned inside a border of the second lower storage electrode or the second upper storage electrode in a plan view;
the light emitting display device includes a third pixel provided near the first pixel, and including a third lower storage electrode, a third gate electrode of a third driving transistor, and a third upper storage electrode, and
the second pixel and the third pixel are positioned on respective sides of the first pixel.

14. The light emitting display device of claim 13, wherein:
the first gate electrode and the third gate electrode have second sides facing each other in a plan view,
the second side of the first gate electrode is positioned inside a border of the first lower storage electrode or the first upper storage electrode in a plan view; and
the second side of the third gate electrode is positioned inside a border of the third lower storage electrode or the third upper storage electrode in a plan view.

15. The light emitting display device of claim 14, wherein:
the first pixel further includes a first input transistor for receiving a data voltage from a data line;
the first gate electrode includes a first protrusion connected to the first input transistor; and
regarding the first gate electrode, a first portion including the first side is connected to a second portion including the second side through the protrusion.

16. The light emitting display device of claim 13, wherein:
the first pixel further includes a first input transistor for receiving a data voltage from a first data line and including a first semiconductor;
the second pixel further includes a second input transistor for receiving a data voltage from a second data line and including a second semiconductor;
the third pixel further includes a third input transistor for receiving a data voltage from a third data line and including a third semiconductor;
the first gate electrode includes a first protrusion connected to the first input transistor;
the second gate electrode includes a second protrusion connected to the second input transistor;
the third gate electrode includes a third protrusion connected to the third input transistor,
the first pixel further includes a first connecting member for connecting the first protrusion and the first input transistor;
the second pixel further includes a second connecting member for connecting the second protrusion and the second input transistor;
the third pixel further includes a third connecting member for connecting the third protrusion and the third input transistor;
the second semiconductor included in the second input transistor is bent in a direction that is distant from the first semiconductor and is connected to the second connecting member; and
the third semiconductor included in the third input transistor is bent in a direction that is distant from the first semiconductor and is connected to the third connecting member.

17. The light emitting display device of claim 16, wherein the first semiconductor is not bent and extends in one direction.

* * * * *